United States Patent [19]

Green et al.

[11] Patent Number: 4,696,096

[45] Date of Patent: Sep. 29, 1987

[54] REWORKING METHODS AND APPARATUS FOR SURFACE MOUNTED TECHNOLOGY CIRCUIT BOARDS

[75] Inventors: LaVerne M. Green, Danbury; Adrio L. Vannoni, Redding Ridge; Ivan K. Pummell, New Milford, all of Conn.

[73] Assignee: Micro Electronic Systems, Inc., Brookfield, Conn.

[21] Appl. No.: 832,040

[22] Filed: Feb. 21, 1986

[51] Int. Cl.⁴ .......................... H05K 3/00; B23P 19/00
[52] U.S. Cl. .......................................... 29/829; 29/700; 228/20; 228/180.2
[58] Field of Search .......................... 228/19, 20, 180.2; 29/762, 829, 700

[56] References Cited

U.S. PATENT DOCUMENTS

| | | | |
|---|---|---|---|
| 3,382,564 | 5/1968 | Gallentine | 228/20 X |
| 3,840,978 | 10/1974 | Lynch et al. | 228/180.2 |
| 4,066,204 | 1/1978 | Wirbser et al. | 228/20 X |
| 4,103,814 | 8/1978 | Nishioka | 228/180.2 X |
| 4,295,596 | 10/1981 | Doten et al. | 228/180.2 |
| 4,366,925 | 1/1983 | Fanene | 228/20 |
| 4,436,242 | 3/1984 | Shisler et al. | 228/19 X |
| 4,552,300 | 11/1985 | Zovko et al. | 228/20 |
| 4,564,135 | 1/1986 | Barresi et al. | 228/20 X |
| 4,605,152 | 8/1986 | Fridman | 228/20 X |

Primary Examiner—Howard N. Goldberg
Assistant Examiner—Carl J. Arbes
Attorney, Agent, or Firm—Mattern, Ware, Stoltz & Fressola

[57] ABSTRACT

Methods and apparatus for reworking printed circuit boards carrying surface mounted components by removing faulty or improperly connected components and replacing them with new components, incorporate an X-Y table for clamping the board with the target component positioned on a vertical working axis, using a heated, component-gripping vacuum head movably mounted for vertical movement and angularly rotatable pivoting adjustment, and jets of hot compressed air directed at the component's peripheral terminal leads, bringing them to solder-melting temperature, with a reversible angular drive motor connected to deliver torque to the head gently or abruptly or in reciprocating fashion, producing pivoting head movement over a small angle of rotation, shearing the adhesive which bonds the component in place, all under control of a programmed microcomputer governing operating sequences selected and initiated by the operator. The same mechanisms and techniques are employed to position and solder a new component in place.

15 Claims, 15 Drawing Figures

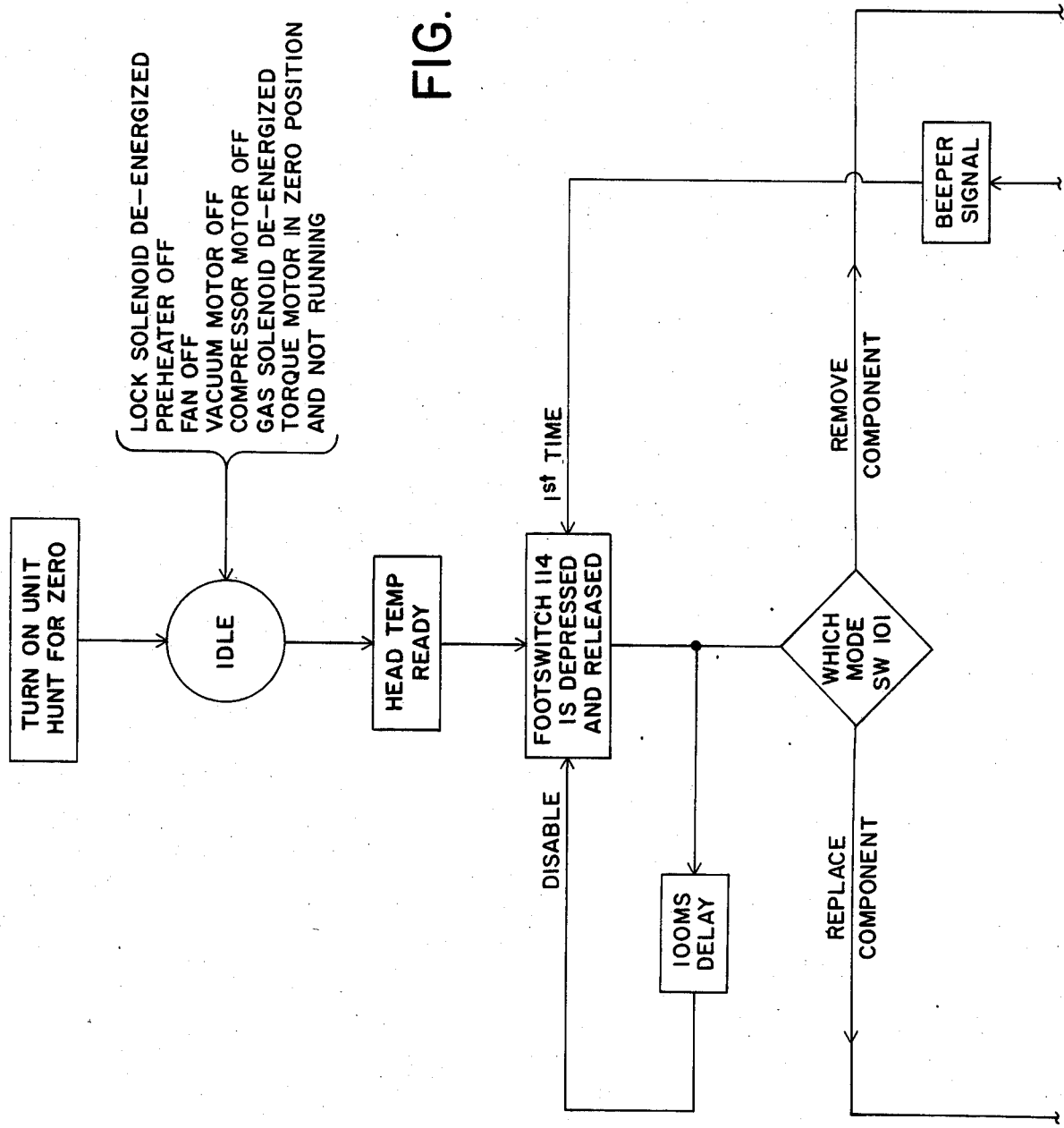

| FIG. 8A | |
|---|---|
| FIG. 8B | FIG. 8C |
| FIG. 8D | FIG. 8E |

FIG. 8F

REWORKING METHODS AND APPARATUS FOR SURFACE MOUNTED TECHNOLOGY CIRCUIT BOARDS

This invention relates to methods and apparatus for removing and replacing surface mounted components on printed circuit boards, and more particularly to reworking boards carrying surface mounted components, to correct manufacturing errors caused by misalignments, faulty solder fillet connections or defective components.

The invention employs novel techniques for firmly gripping a component while heating the leads and the solder to a solder-melting temperature, quickly torquing the component through a small angle of rotation to shear any cement securing it to the board, withdrawing the component from the board, delivering a substitute component into position, and installing it by soldering it in its desired position on the board.

Progressive reduction in the sizes of printed circuit boards and the active and passive components mounted on them have led to expanding use of "SMT" or surface mounted technology, employing circuit boards with or without plated through holes. Terminals are merely metal pads plated on the board surface in rows corresponding to spread-eagled "gull wing" component terminal leads, or to tucked-under "J-type" terminal leads. SMT boards promote miniaturization by packing connections together more densely, achieving better performance and reduced cost. When component leads inserted in terminal holes are not used, positive alignment of "SMC" or surface mounted components is difficult, and patches of adhesive such as dots of epoxy cement are often used to hold components in their desired aligned positions on the board until soldering of terminal connections is completed. Skewed or misaligned components or faulty components are sometimes encountered, and solder fillet connections sometimes fail to bridge the gaps between component leads and plated terminal pads on the board Thus, reworking of the boards is often necessary to avoid economic losses involved in rejecting faulty boards. However, the minuscule size of many surface mounted components, their densely packed connections and the tenacity of the adhesives securing these components to the boards makes manual reworking of such boards highly dependent on operator skill, and difficult to perform successfully at reasonable cost.

The methods and apparatus of the present invention overcome these obstacles efficiently and economically They employ an X-Y translatable board clamping base, with interchangeable component-gripping heads easily maneuvered into position. An automatic component-removal cycle applies heat, vacuum and precise component manipulation to sever its bonds and remove it from the SMT circuit board. A new component is readily substituted, and the board is thus quickly and economically reworked, eliminating unneeded waste and increasing productivity.

Accordingly, a principal object of the present invention is to provide methods and apparatus for economically reworking surface mounted technology or "SMT" printed circuit boards.

Another object of the invention is to provide such methods and apparatus capable of precise gripping and manipulation of surface mounted components to remove them from the boards on which they are mounted.

A further object is to provide such methods and apparatus capable of preheating the board and locally heating the soldered terminal connections to desoldering temperature.

Still another object is to provide such methods and apparatus incorporating torque-applying means for quickly shearing adhesive patches securing a gripped component to the board.

A still further object is to provide such methods and apparatus affording precise angular adjustment of the component gripping means to accommodate skewed and misaligned components, together with accurate alignment means for assuring that a replacement component will be installed precisely in its desired aligned position on the board's solder terminal pads.

Another object of the invention is to provide such methods and apparatus incorporating automatic microcomputer control to govern the sequence of all operations in an orderly manner.

Other objects of the invention will in part be obvious and will in part appear hereinafter.

The invention accordingly comprises the features of construction, combinations of elements, and arrangements of parts which will be exemplified in the constructions hereinafter set forth, and the scope of the invention will be indicated in the claims For a fuller understanding of the nature and objects of the invention, reference should be made to the following detailed description taken in connection with the accompanying drawings, in which:

THE DRAWINGS

Figure 5:
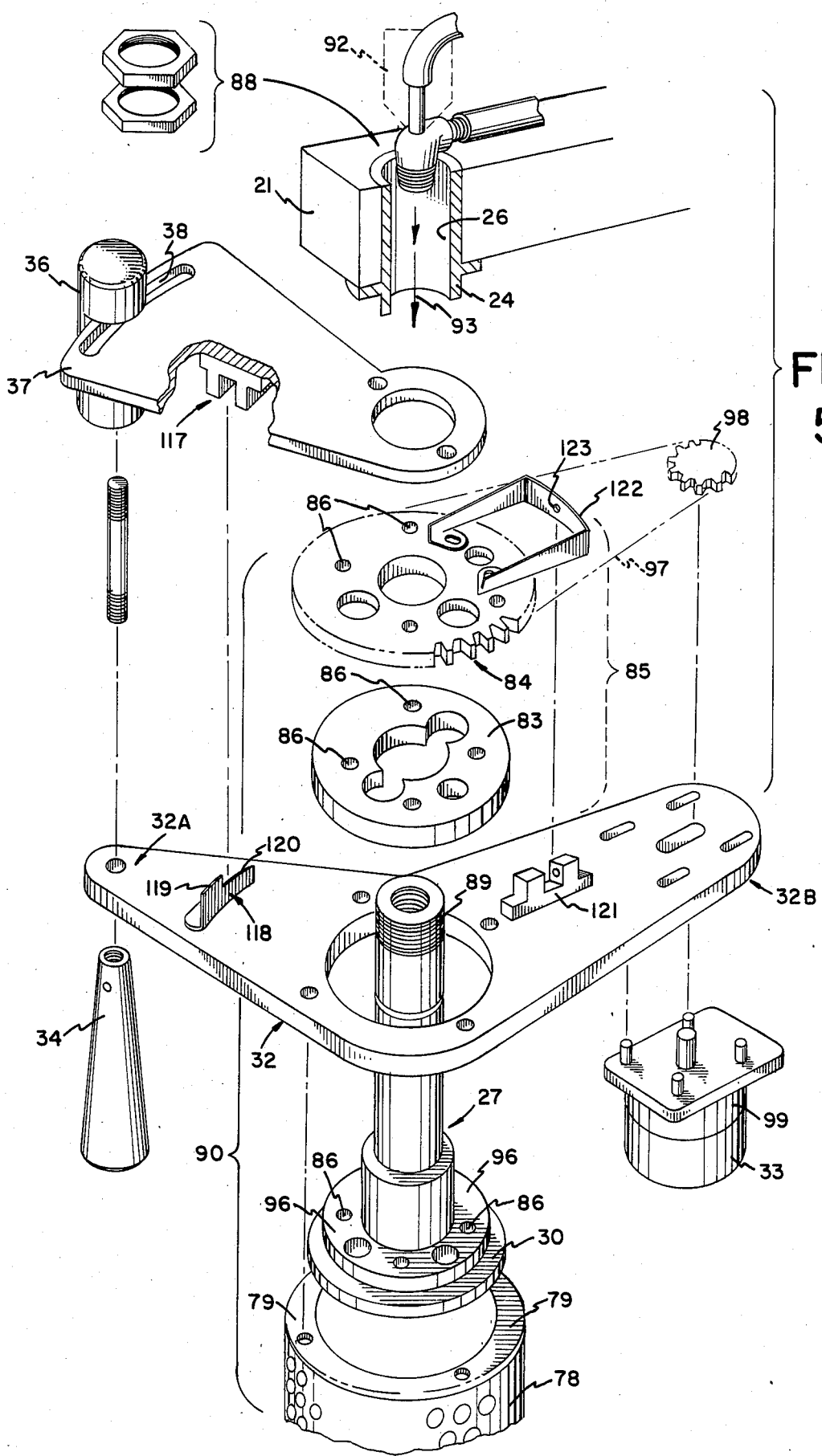
FIG. 5 is an exploded perspective view of the components and sub-assemblies forming the device shown in FIG. 2.
Figure 6:
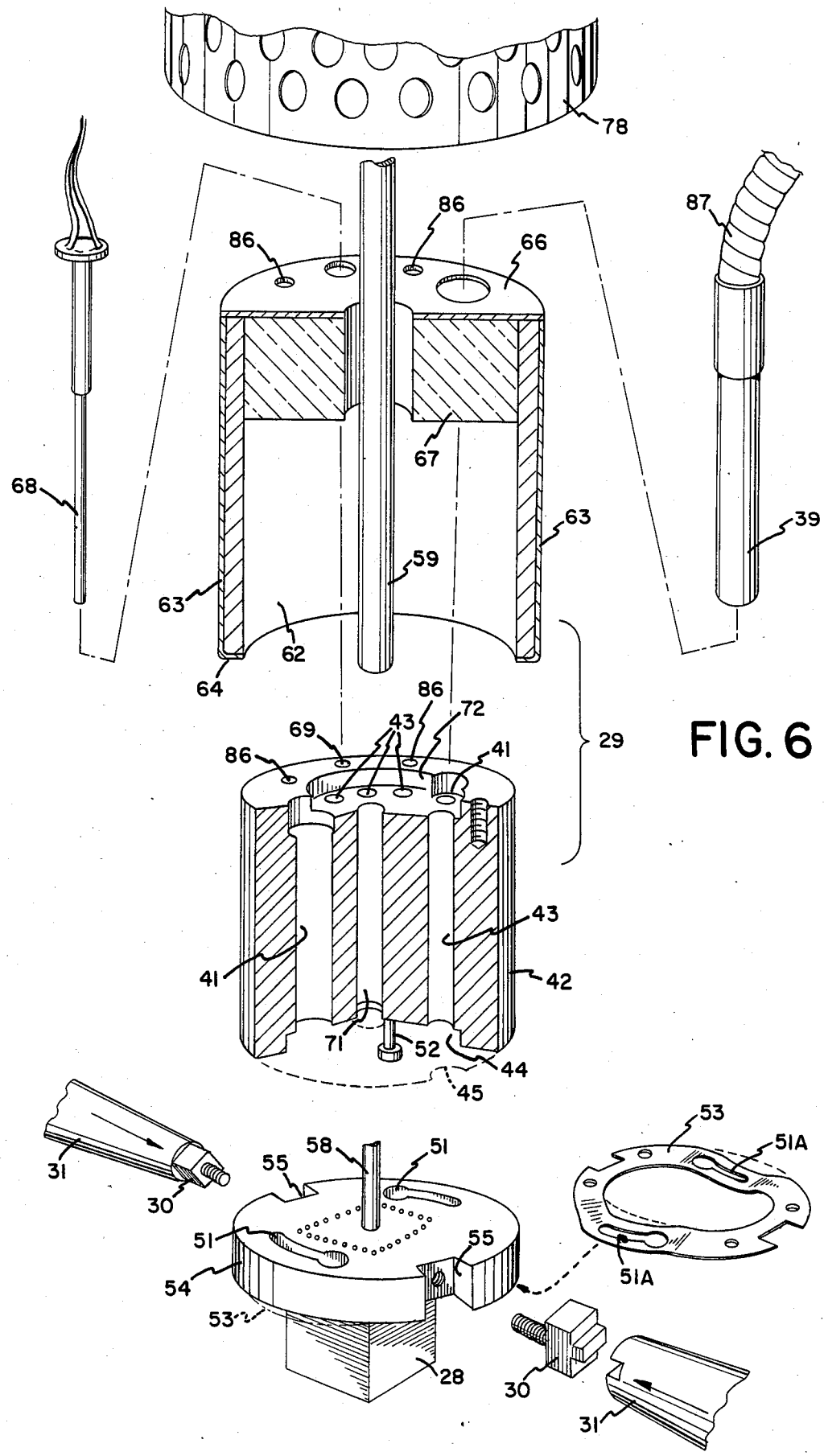
FIG. 6 is an exploded perspective view of the components and sub-assemblies forming the lower end of the device shown in FIG. 2, and comprising the heater head employed for heating and gripping the surface mounted components to be removed from the printed circuit board.
Figure 7A:
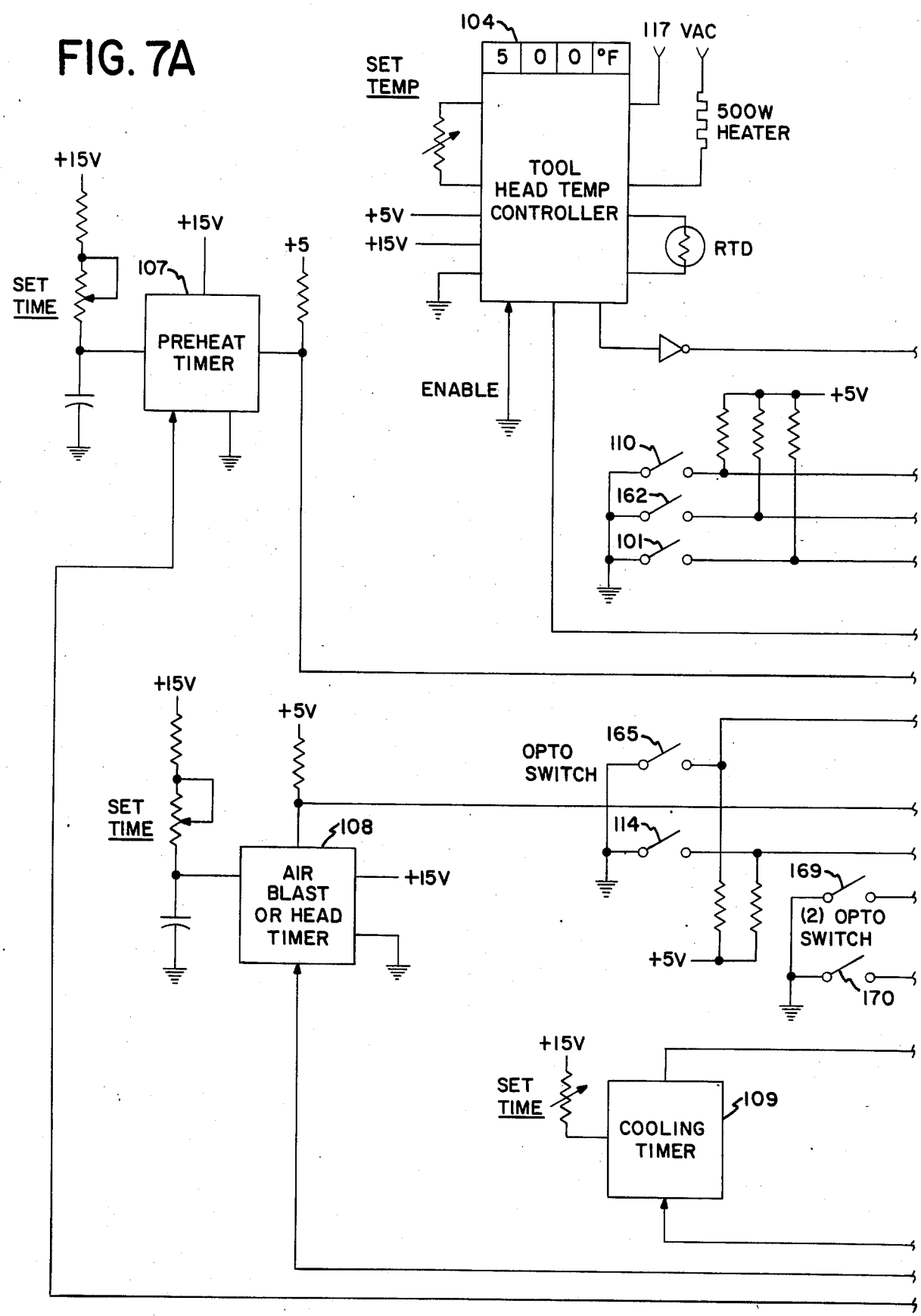
Figure 7B:
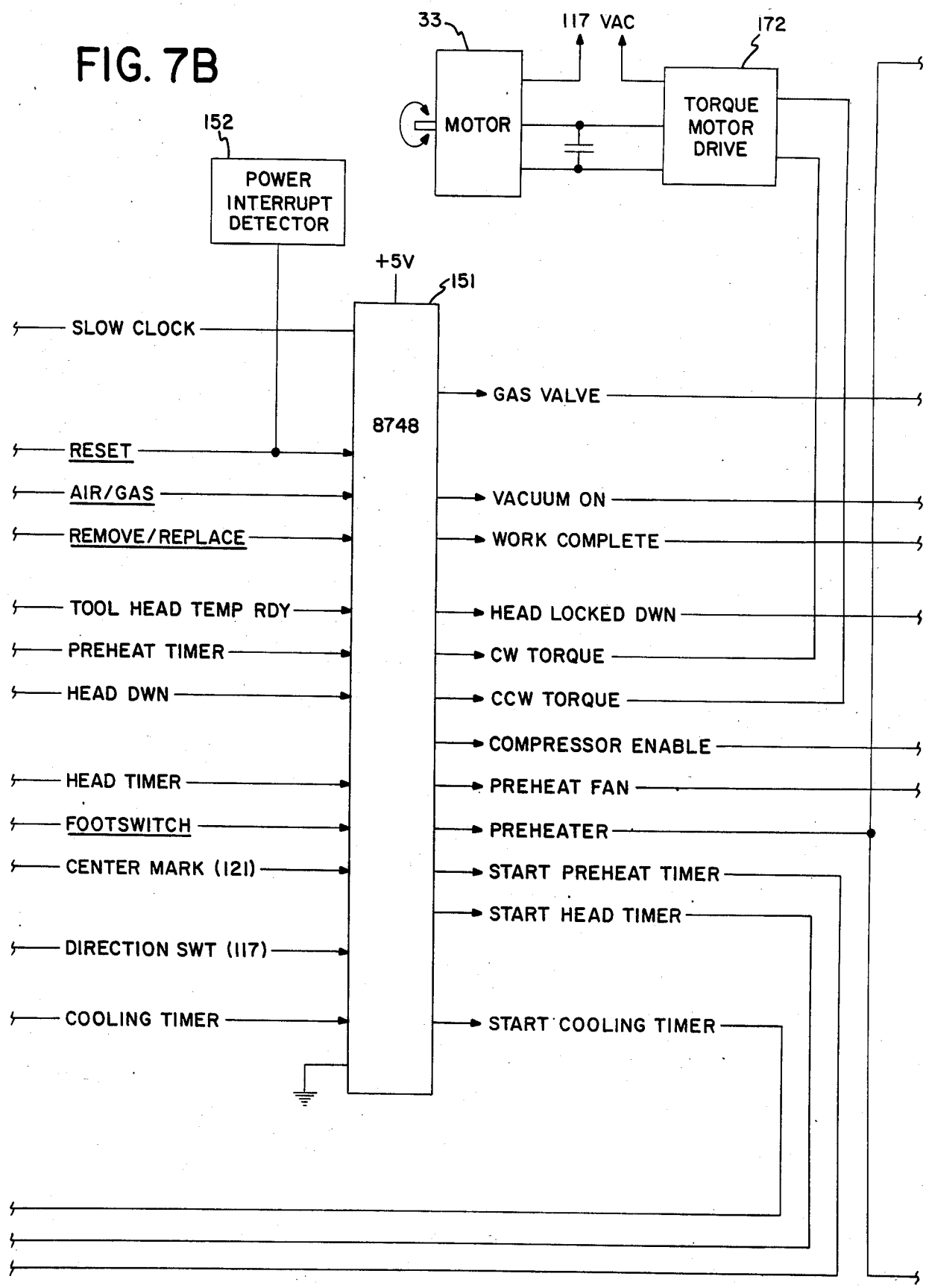
Figure 7C:
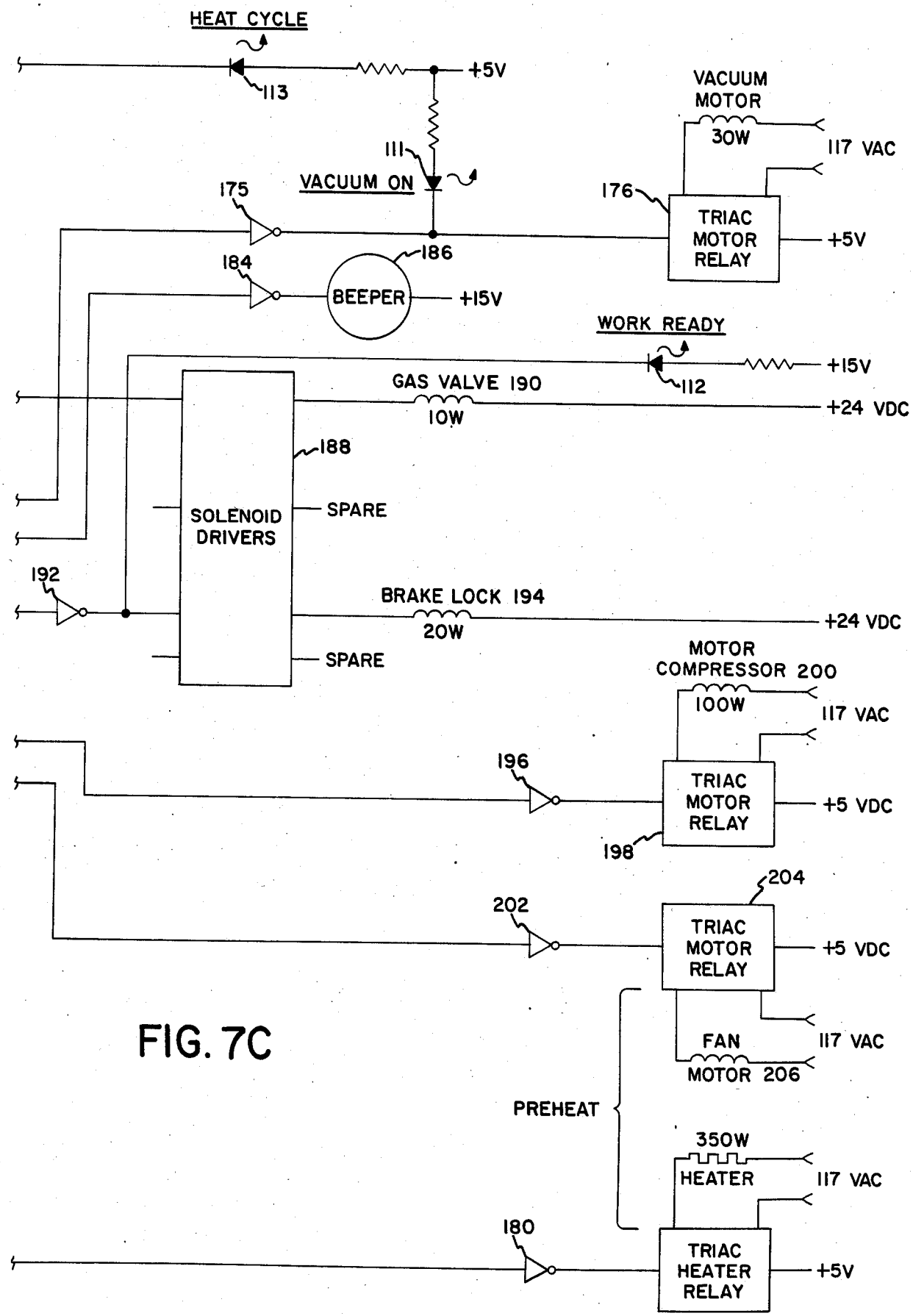
Figure 8B:
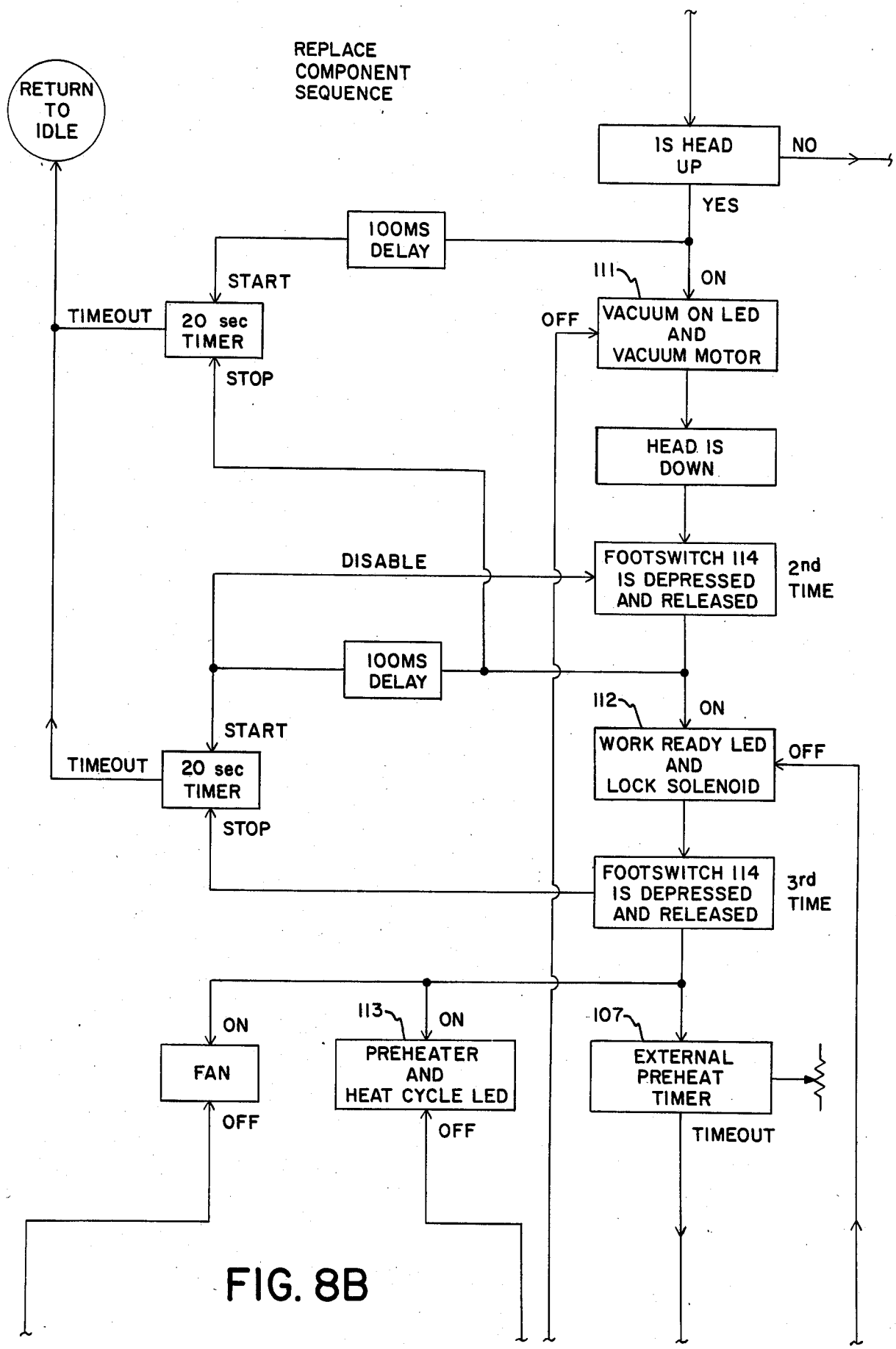
Figure 8C:
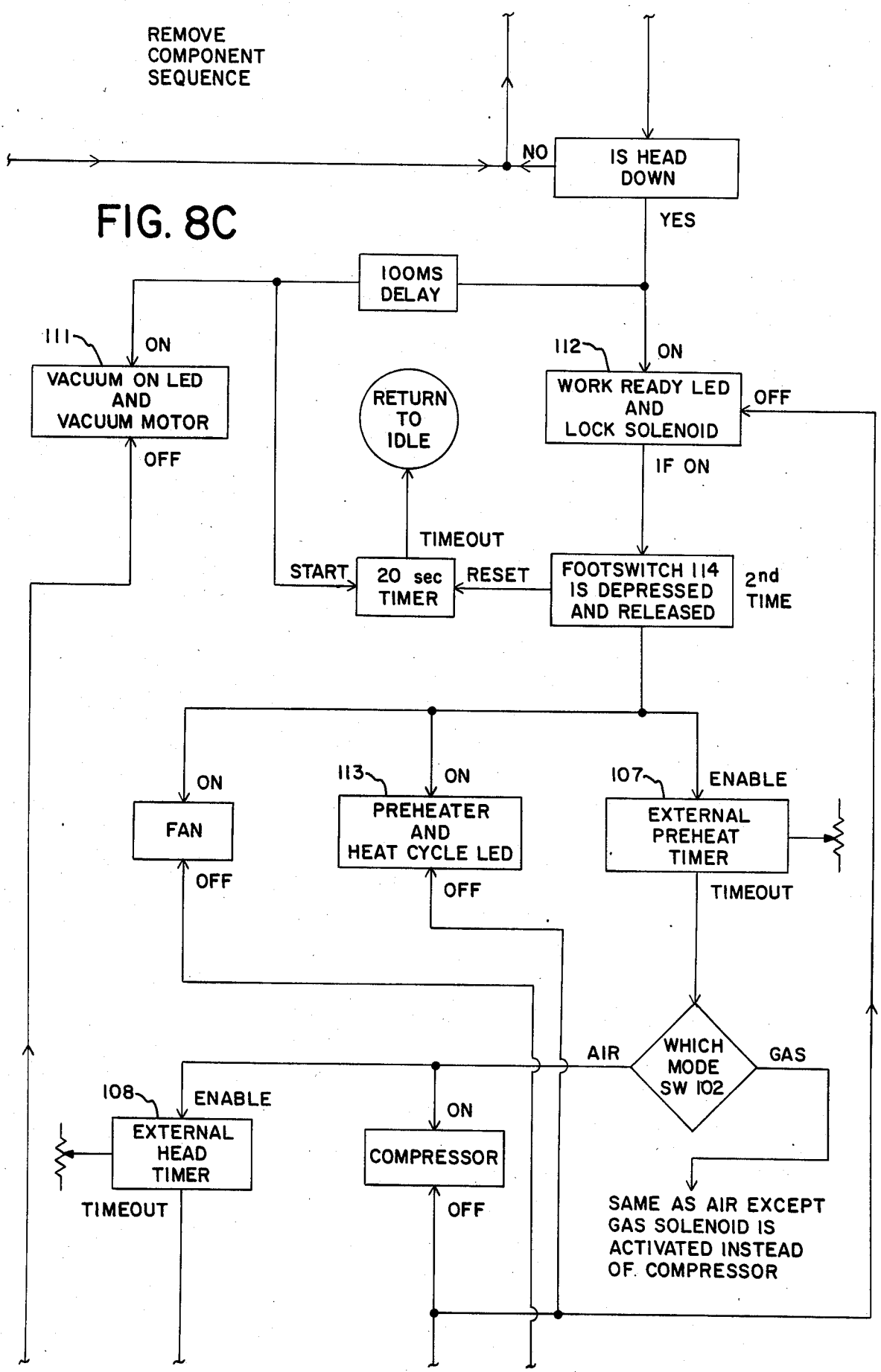
Figure 8D:
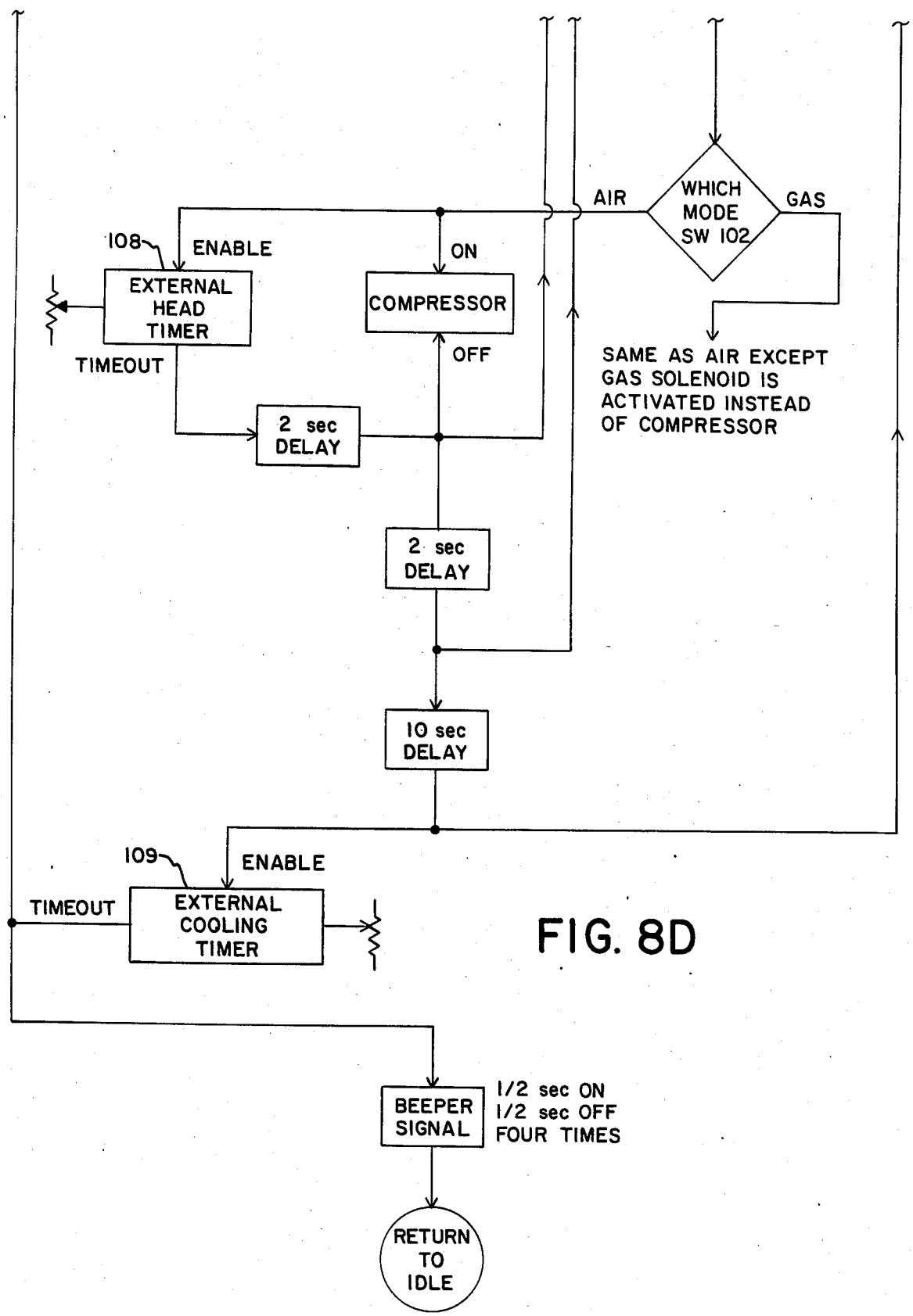

FIGS. 7A, 7B and 7C comprise a schematic block diagram of the control circuitry governing the operation of the device of FIGS. 1-6;

FIGS. 8A-8E are five contiguous portions of an operational flowchart showing the sequence of the events produced by the automatic control circuitry; and FIG. 8F is a schematic diagram showing the contiguous arrangement of FIGS. 8A-8E to form the overall operational flowchart.

Figure 1:
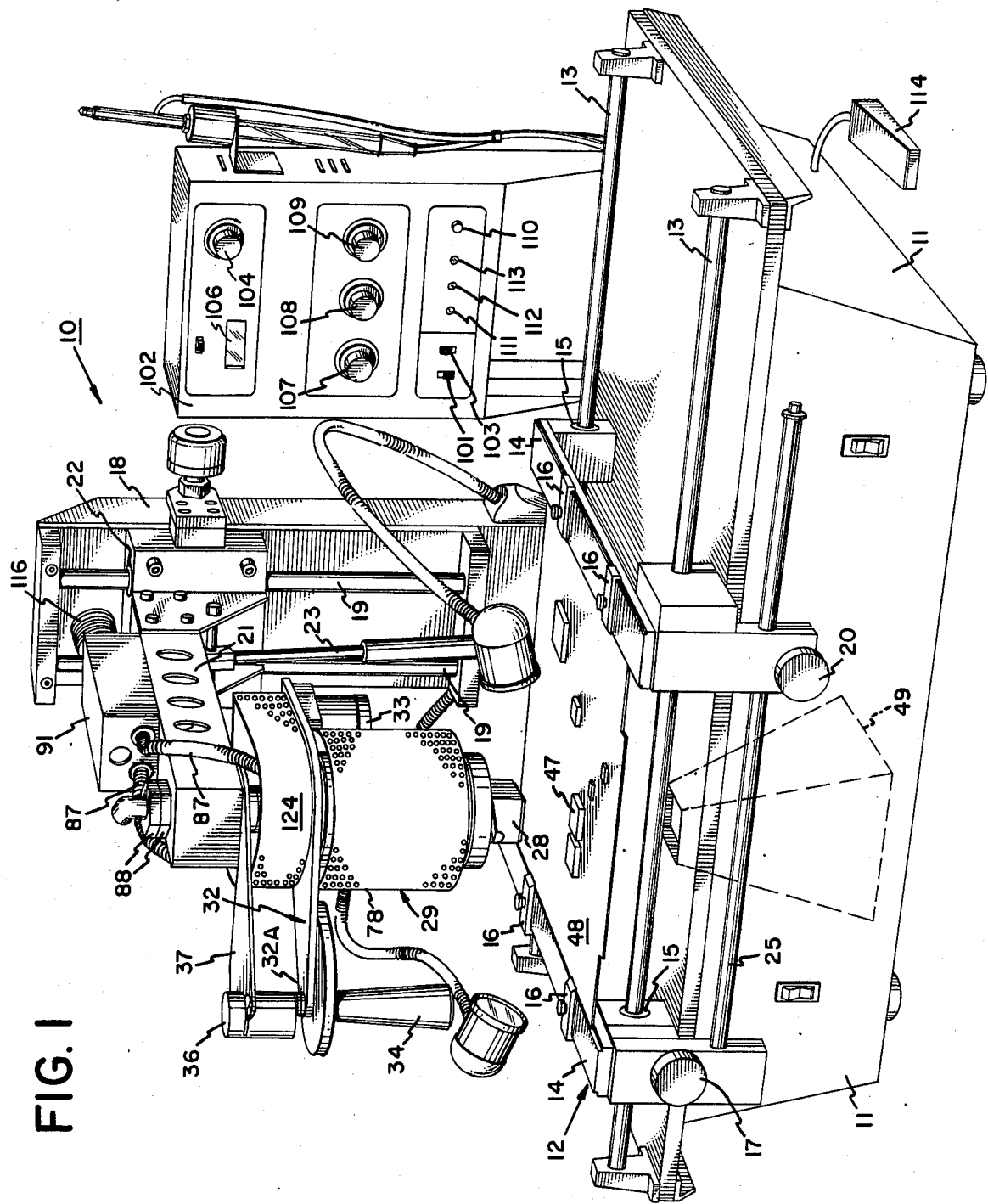
FIG. 1 is a front perspective view of a preferred embodiment of the apparatus employed in performing the methods utilized in the techniques of the present invention, with the moveable component gripping mechanism shown in the upper foreground.

The SMD Terminal for Assembly and Rework or "STAR" system of the present invention is embodied in the board reworking unit 10 shown in FIG. 1. Unit 10 incorporates a base 11 adapted to be supported by a workbench or work table. Extending from side to side across the front and rear of the base 11 are two rails 13 accommodating between them a reciprocating slidable clamping frame 12.

The frame 12 is formed by a pair of bridge members 14, spanning the space between the front and rear rails 13 and mounted thereon on linear bearings 15 for independent or ganged reciprocating side to side movement from one side to the other of the base 11. The width of the clamping frame 12 may be adjusted by lateral movement of the right-hand bridge member 14 toward the left-hand bridge member 14, to accommodate most widths of printed circuit boards, and a sliding clamp on a tie bar 25 may be clamped by turning a ganging knob 20, locking the width of frame 12.

The circuit board 48 is clamped sanning the open central region of frame 12 by edge clamp assemblies 16, each mounted on bridge members 14. Unclamping and sliding the printed circuit board forwardly or rearwardly between rails 13 along bridge members 14 allows ready positioning of the printed circuit board from front to rear. Linear bearings 15 likewise allow ready lateral adjustment of frame 12 from side to side along the full length of rails 13.

A clamping knob 17 is provided to lock the frame 12 in any adjusted position and the edge clamp assemblies 16 on both bridge members 14 may similarly be clamped to lock the printed circuit board in the desired forward to rearward position above base 11.

Upstanding behind base 11 is a column 18 incorporating vertical guide rods 19. Extending forward from the upper end of column 18 is a projecting arm 21, mounted on linear bearings 22 engaging vertical guide rods 19 providing reciprocating vertical movement of arm 21 over a stroke of at least 4 inches. The weight of arm 21 is counter-balanced by pneumatic cylinder 23 extending between the rear end of arm 21 and base 11 near the lower end of column 18, so that manipulation of arm 21 urging it downwardly compresses the air in the pneumatic cylinder 23.

Figure 2:
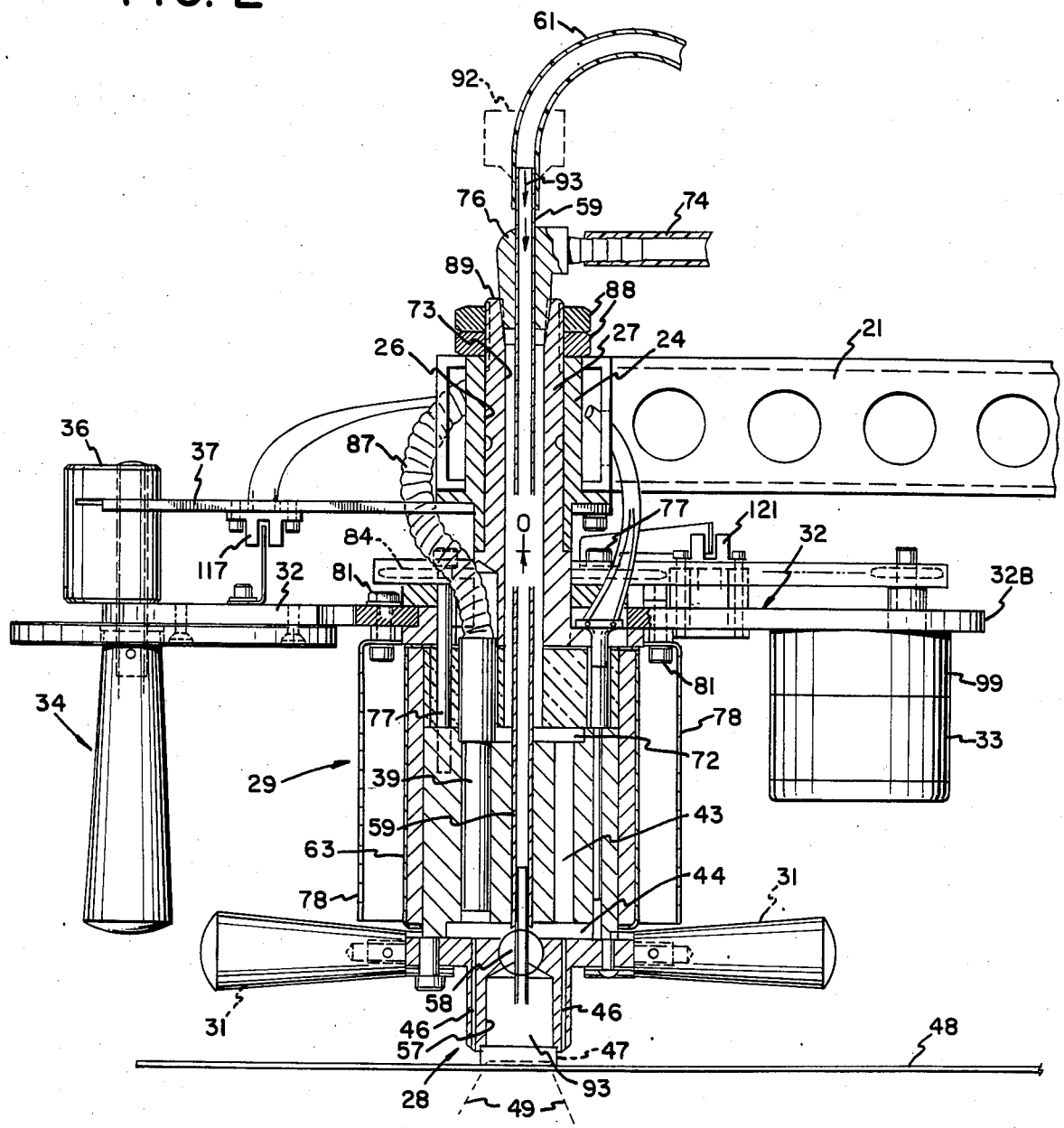
FIG. 2 is schematic elevation view of the component gripping head and its maneuvering mechanism broken away in cros section to show its internal construction.

Arm 21 is preferably a box beam structure providing considerable stiffness, with its outer forward end being provided with a bearing sleeve 24 having a vertical bore 26 providing a freely rotatable bearing support for a hollow bearing shaft 27, best shown in FIG. 2.

Thus, in a manner somewhat resembling a drill press, the forwardly protruding arm 21 provides rigid, sturdy support for the component gripping head 28 shown at the lower end of FIG. 2 and all of its associated cooperating systems and attachments.

Gripping head 28 and the parts forming the compressed air heater sub-assembly 29 are shown in FIG. 6 while all the maneuvering and positioning components used to move gripping head 28 into its operating position are best shown in FIG. 2 and in the exploded view of FIG. 5. A pair of removable head changing handles 31 are shown in FIG. 2, indicated in their head-engaging position in dashed lines. These handles 31 are designed for convenient snap-on or threaded attachment on both sides of head 28, in the position shown in FIGS. 2 and 3. After installation, the handles are used to twist head 28 to disconnect it from its bayonet fitting and remove it from the lower end of the heater sub-assembly 29. A separate head 28 is used for each differently shaped component, and the same handles may be used for the installation of the next head to be used for a different sized component by mounting the same handles on the new head, inserting it in the lower end of the sub-assembly 29 and torquing it through its bayonet attachment motion to latch it in its engaged position. Handles 31 are then removed during operation of the device.

A boomerang shaped motor mounting plate 32 forms an angularly pivotable assembly with bearing shaft 27, the gripping head 28 and heater sub assembly 29. Motor mounting plate 32 is provided with two protruding ends, a rearward protruding end 32B on which motor 33 is dependingly mounted, and an opposite forward end 32A protruding diagonally toward the left front corner of the machine, supporting a downwardly extending clamp handle 34, co-acting with an upwardly extending clamp 36, engaging a fixed clamp bracket 37 having a sector shaped slot 38, subtending an arc of about 30 degrees at a radius of about 5 inches from the central axis of bearing shaft 27.

Clamp handle 34 is provided with a threaded shaft co-acting with clamp 36 to form a C-clamp whose clamping jaw grips clamp bracket 37 when handle 34 is turned in a clockwise direction as viewed from below. Clamp bracket 37 is securely bolted to the underside of the outer end of supporting arm 21. As shown in FIG. 2, handle 34 is secured by a set screw or roll pin to a threaded coaxial clamping shaft extending upward through an unthreaded hole in the lower portion of clamp 36 into a coaxial threaded hole in the upper portion of the clamp, which thereby becomes a clamping jaw.

A pair of heavy duty electrical resistance heaters 39 are embedded in mating bores 41 formed in a solid aluminum heat transfer block 42 incorporating vertical air channels 43 through which compressed air is delivered downward into a lower plenum chamber 44 formed at the lower end of block 42. During its passage through block 42 this compressed air absorbs heat from the block and the heated air passes downward from chamber 44 through a large plurality of vertical air delivery passages 46 formed in heater head 28, delivering the hot air directly to the periphery of the component 47 gripped in the component gripping head 28.

This component 47 is shown at the lower end of FIG. 2, resting in its desired position on the printed circuit board 48. Directly beneath the printed circuit board 48 and component 47 is the exhaust vent of a preheater 49 delivering hot air to the underside of circuit board 48 directly beneath component 47. Preheater 49 is also shown schematically in FIG. 1 and it normally consists of an electric heating grid and a power driven fan driving fresh intake air past the heating grid and through the outlet directed at the underside of the circuit board as shown in FIG. 2.

Figure 3:
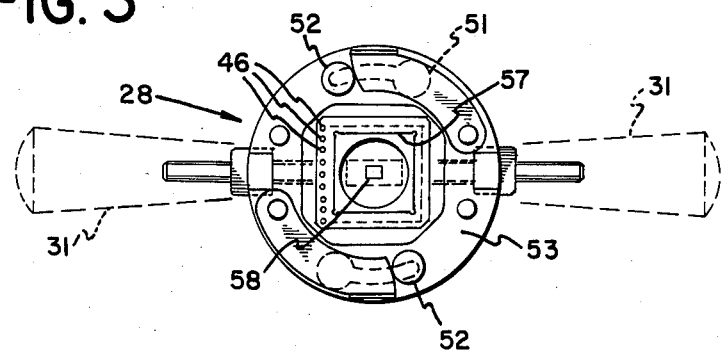
FIG. 3 is a fragmentary bottom plan view of the device shown in FIG. 2.

As indicated in FIGS. 3 and 6, the removeable and interchangeable component gripping heater head 28 is adapted, by its curved sector shaped keyhole slots 51, for telescoping bayonet style twisting engagement on downwardly protruding mounting screws 52 extending from threaded holes in the lower surface of heat transfer block 42, as shown in FIG. 5.

Co-acting with the heads of mounting screws 52 as they protrude through the lower end of keyhole slots 51 is a resilient leaf spring washer 53 screwed to the underside of upper flange 54 of head 28. Spring washer 53 is provided with downwardly arched sectors coinciding with the small end of keyhole slots 51A aligned with slots 51 in flange 54. The sring action of washer 53 urges gripping head 28 firmly upward in secure heat-transmitting engagement with heater block 42.

For removal of head 28, after attaching handles 31, counterclockwise rotation (viewed from below) allows the entire head 28 to be rotated, with slots 51 and 51A sliding along screws 52 until the heads of the screws are aligned with the enlarged ends of the keyhole slots 51 in flange 54 and washer 53, at which rotational position the head 28 may be moved downwardly by handles 31 and disengaged from the lower end of heat transfer block 42, in order that a different head 28 may be selected and installed by reversing the foregoing steps, providing a component gripping aperture of the desired size and shape for a different component to be gripped.

Handles 31 are detached from studs 30 and removed during operation. If desired, handles 31 may be provided with detachable base camming studs 30 threaded into notched seats 55 in the rim of flange 54 of head 28. Studs 30 have a flat sector across a chordal portion of their periphery, which is otherwise circular to engage a circular sector groove 45 formed in the lower rim of heater block 42. By twisting handles 31, studs 30 are threaded into seated engagement in notched seats 55, engaging grooves 45 to block rotation of head 28 until handles 31 are re-attached and studs 30 are turned to bring their flat sectors facing block 42, permitting rotation of head 28 and its bayonet-style detachment from block 42.

Flat pack components in square or rectangular shapes are commonly used in surface mounted technology circuit boards, and a square flat pack gripping aperture is illustrated at the lower end of component gripping head 28 shown in the FIGURES. Different shapes and sizes of component gripping apertures in different heads 28 are dimensioned to mate with other standard shapes and size of surface mounted components.

The lower aperture end of head 28 forms a hollow vacuum cup 57, abutting the upper surface of the component 47 to be gripped and forming therewith a hollow vacuum chamber communicating with a vacuum source through a vacuum conduit 58 extending axially upward through the center of head 28 into telescoping engagement with a vacuum supply tube 59. Tube 59 is positioned in the central passage formed in the heat transfer block 42 and its associated supporting structures, thus extending axially upward through bearing shaft 27 to the top of the overall assembly where a vacuum hose 61 connects it to a vacuum pump.

The heater components assembled at the lower end of the device supported by arm 21 are shown assembled in FIG. 2 and disassembled in the exploded perspective view of FIG. 6. In these Figures it will be note that the heat transfer block 42 supporting gripping head 28 is positioned inside cylindrical tubular insulating sleeve 62 which is itself positioned inside a cylindrical sheet metal enclosure 63.

Enclosure 63 is provided with an open lower end having an inturned flange 64 securing the sleeve 62 in position. The upper end of enclosure 63 is formed as an apertured metal disk 66 having its rim integrally joined to the upper end of the cylindrical enclosure 63, by welding for example. Directly beneath disk 66 inside enclosure 63 is a relatively thick disk 67 of heat insulating material. Disk 67 and sleeve 62 may be foamed ceramic, "Fiberfrax," or the like.

Disk 67 has several apertures corresponding to those formed in overlying disk 66 to accommodate the interengaging components. Each resistance heater 39 extends through one such aperture in disks 66 and 67 into its bore 41 in heat transfer block 42, for example. In a similar manner, a temperature dependent resistor heat sensor 68 extends through disks 66 and 67 into another bore 69 in heat transfer block 42 whose lower end is closed by the flange 54 of component gripping head 28, as illustrated in FIG. 2. Air channels 43 form similar bores extending through the entire length of heat transfer block 42 and a central axial passage 71 accommodates vacuum supply tube 59. As shown in FIG. 6, each of these passages corresponds to or is connected with an aperture extending through disks 66 and 67.

The upper end of heat transfer block 42 is recessed to form a plenum chamber 72, similar to chamber 44 recessed in the lower end of block 42, and connecting the upper ends of air channels 43 with the central bore 73 in bearing shaft 27. This is connected to a compressed fresh air or compressed gas supply tube 74 overlying arm 21 through a suitable angle elbow fitting 76, which also accommodates vacuum supply tube 59 as shown at the upper end of FIG. 2. Additional apertures are formed in disks 66 and 67 to accommodate elongated mounting screws 77 securing the heater assembly 29 to the overlying support structure, hereinafter described, mounted on and carried by the lower stepped flange of bearing shaft 27.

Figure 4:
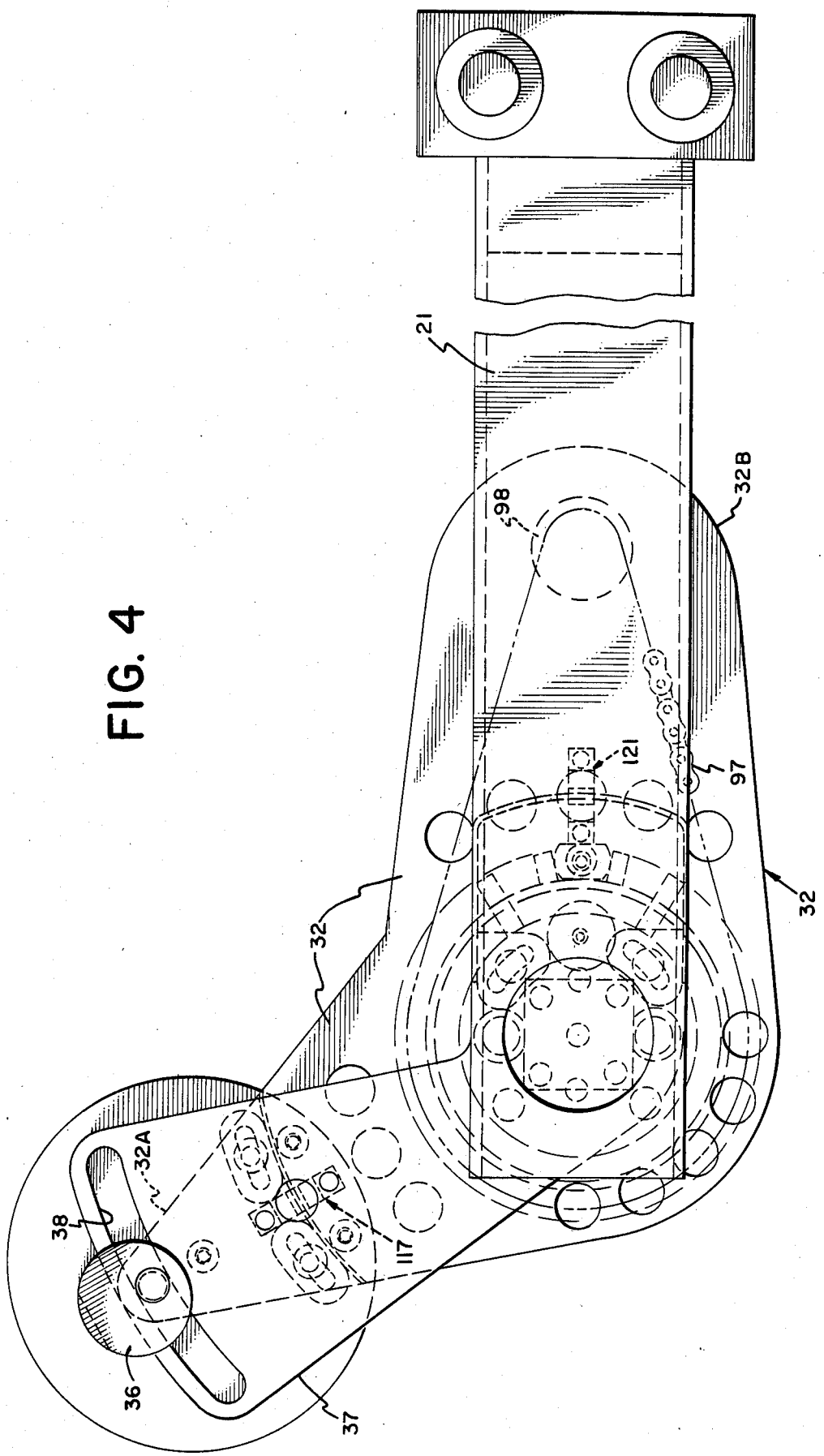
FIG. 4 is an enlarged top plan view of a portion of the device shown in FIG. 2.

To assure that the operator is protected from contact with the heater assembly 29, an outer perforated cylindrical heater shield 78 has its upper inturned flange 79 bolted to the boomerang shaped motor mounting plate by bolts 81, as indicated in FIGS. 2 and 4.

Component Maneuvering Sub-Assembly

The cooperating parts of the device used to maneuver the component gripping head 28 throughout the operating cycles of the invention are best shown in FIGS. 2, 4 and the exploded view of FIG. 5. In these views it will be seen that the boomerang-shaped motor mounting plate 32 provides the moveable platform governing the angular positioning of the component gripping head 28 bolted to the lower end of the heat transfer block 42. This block 42 and its enclosure 63-66 are securely bolted by four bolts 77 to a hub assembly 85 riding on the lower flange 30 of bearing shaft 27. This hub assembly 85 includes a bearing plate 83 and a sprocket wheel 84, respectively seated on the stepped flange 30 at the lower end of bearing shaft 27. Bolts 77 are passed through aligned holes 86 shown in FIGS. 5 and 6 in sprocket wheel 84, bearing plate 83, stepped flange 30, disk 66 and insulated disk 67, and are threaded into corresponding threaded holes 86 formed in the upper end of heat transfer block 42. This entire assembly 90 comprising parts 84-83-27-30-66-67-42-28 is therefore free to rotate as a unit within bearing sleeve 24 mounted at the front or outer end of arm 21, for angular rotation through a range or sector of approximately 30 degrees, carrying with it the angle elbow fitting 76 on which vacuum hose 61 and compressed air or compressed gas supply tube 74 are mounted.

As indicated in the drawings, the heavy power cables 87 preferably protected by helical BX sheathing bring power from the rear of the device along arm 21 and down in front of the outer end of the arm into apertures through which they are connected to the resistance heater elements 39. A pair of nuts 88 forming a locking assembly are threaded on the upper threaded end 89 of bearing shaft 27, riding for free angular pivoting movement on the upper end of the bearing sleeve 24 and providing the support for the assembled pivotably moveable assembly just described, extending vertically from vacuum hose 61 down to component gripping head 28 as indicated in FIG. 2.

Directly behind nuts 88 on top of arm 21 is mounted for convenience a junction box 91 from which cables 87 and wiring for motor 33 is connected via the control circuitry shown in the circuit diagram of FIG. 7. An optional target lamp 92 mounted just above angle elbow 76 may be used if desired to provide a direct beam of light 93 aimed vertically downward along the vertical axis of the bearing shaft 27 directly through the vacuum supply tube 59 and vacuum conduit 58 to provide a bright spot of light aimed at the very center of the target area on the circuit board 48, toward which component gripping head 28 is aimed. This target light spot produced by light source 92 aids the operator in aligning the device during the operating cycle to be described below. The light beam produced by light source 92 is indicated by arrows 93 at the upper and lower ends of the central axis of the device in FIG. 2.

The central portion of the angularly pivotable assembly 90 comprising sprocket wheel 84, bearing plate 83 and flange 30 provides an angular bearing mounting for an additional pivoting structure, motor mounting plate 32, which is mounted as shown in FIG. 2 with its central aperture 94 resting on stepped flange 30 and is positioned encircling the central step 96 of flange 30 for free angular sliding movement thereon. Bearing plate 83 overlies aperture 94 and secures motor mounting plate 32 in its angular pivoting position securely maintaining it in horizontal plane for sturdy accurate positioning.

It will thus be seen that motor mounting plate 32 carrying motor 33 is angularly moveable about hub 85 of assembly 90 relative to the overlying clamp bracket 37, and that central assembly 90 extending from lock nuts 88 down to gripping head 28 is separately and independently moveable through an angular sector relative to clamp bracket 37 and motor mounting plate 32. This dual relative angular movement of these two pivoting sub-assemblies 32 and 90 forming the maneuvering portion of the device provides the relative torquing movement characterizing the devices and techniques of the present invention, whose operation will be described below.

It should be noted that reversible motor 33 is provided with a seed reducer 99 whose output shaft carries a sprocket pinion 98 engaged via chain 97 with sprocket wheel 84. Thus motor 33, driving pinion 98 at a seed of 6 rpm, for example, rotates sprocket wheel 84 to produce relative angular pivoting motion between assembly 90 and mounting plate 32 clamped to clamp bracket 37 by clamp 36.

The chain and sprocket mechanism illustrated in FIG. 5 is preferably enclosed in a perforated cover 124 shown in FIG. 1 which may have the same perforated sheet metal construction as the outermost heater shield 78 bolted to the underside of plate 32. As indicated in FIG. 1, these two protective covers serve to isolate the hottest portion of the device and the chain and sprocket drive from the operator for the operator's protection.

The vertical position of arm 21 may be locked at the desired level by a locking brake 116 mounted at the rear upper portion of the arm 21 behind junction box 91. The brake 116 is provided with a lock solenoid actuated plunger facing and moveable into braking engagement with the front face of column 18 when the lock brake 116 is actuated by the lock solenoid.

Two lamp photocell pairs 117 and 121 are employed to achieve angular repositioning of head 28 to exact X-Y zero position with the vacuum cup cavity on the underside of head 28 in precise alignment with the X-Y axis of board 48 and the operation of these devices will be described below in connection with the torque motor sub-routine in the operating cycle.

Operating Cycles of the Device

In the surface mounted circuit board reworking techniques of the present invention, the microcomputer controlled circuitry shown in FIGS. 7 and 8 provides a choice of operating modes for the operator's selection, an automatic "remove component" sequence, and an automatic "replace component" sequence, which are alternatively selected by operation of switch 101 on the control panel 102 of the device, conveniently mounted behind base 11, beside column 18 as shown in FIG. 1. Directly beside selector switch 101 is a second, air-gas selector switch 103, enabling the operator to select between air from a compressor system and compressed gas such as nitrogen from a compressed gas cylinder.

Temperature selector knob 104 at the upper right corner of control panel 102 allows the operator to select the desired temperature sensed by temperature sensor 68 which will interrupt the power supplied through cables 87 to heaters 39 when that temperature is reached, and thereafter the system will deliver power in short intervals designed merely to maintain head 42 at the temperature selected through knob 104 and displayed on a digital temperature display 106.

Three timer selector knobs 107, 108 and 109 arrayed across the center of control panel 102 respectively permit the operator to determine the number of seconds for a preheat cycle, the number of seconds for the heating cycle in which the hot air or gas delivered through heater block 42 and passages 46 in head 28 is applied to melt the solder on the terminals of the component 47, and the number of minutes for a cooling cycle during which the cooling fan of preheater 49 is delivering cool air past the de-energized preheater grid to cool circuit board 48.

A reset button 110 in the lower right corner of control panel 102 flanks three signal lights, a "vacuum on" light 111, a "work ready" light 112 and a "heat cycle on" light 113, all preferably LEDs showing the operator the condition of the device at each point of the oerating cycle.

The flowchart of FIG. 8 produced on the separate portions of the FIGURE identified as FIGS. 8A, 8B, 8C, 8D and 8E illustrates the effect of the oeration of these various controls on panel 102 in conjunction with the microcomputer control system of the device mounted inside base 11.

Figure 8E:
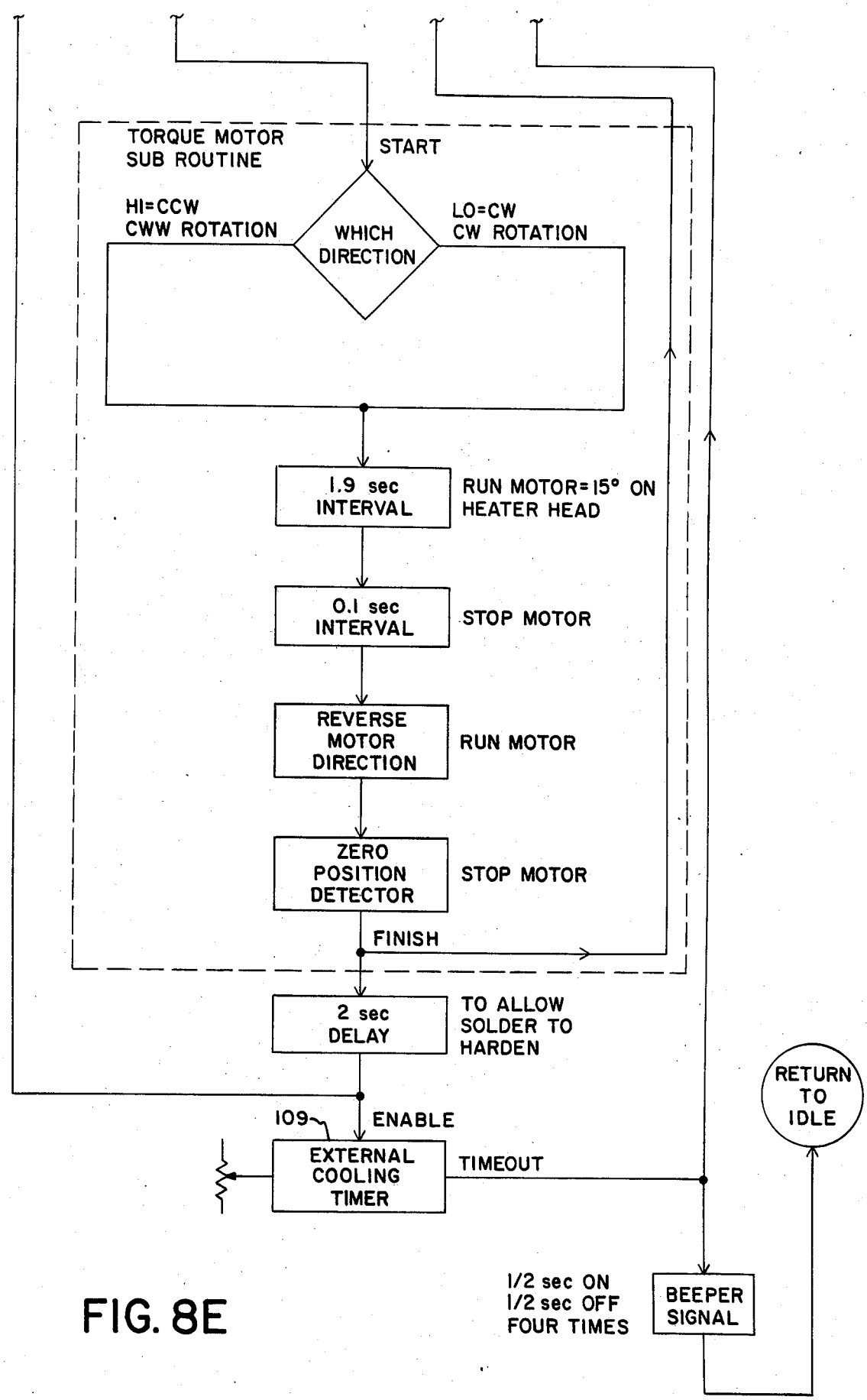

When the operator first actuates the "on" switch and sets the head temperature, heater 39 begins to heat block 42 and motor 33 goes through its sub-routine shown in FIG. 8E, centering head 28 in its X-Y orientation parallel to edges of board 48.

Selector switch 101 is turned to choose the "remove component" mode of oeration. In order to remove component 47, gripper head 28 must be down, embracing the component, maneuvered by handle 34 against the upward force of air cylinder 23. Before lowering head 28, however, its alignment with component 47 must be checked. Light beam 93 from light source 92 should fall directly in the center of component 47 and if this is not true, then clamp 16 or knob 17 must be readjusted to assure that board 48 is positioned exactly under beam 93, with the light beam spot falling directly on the center of component 47. Clamp 16 and handle 17 are then reclamped and head 28 may be lowered by drawing handle 34 downward against the force of pneumatic cylinder 23. If the operator finds that the component 47 is skewed, so that it is not perfectly aligned with the X-Y direction of the edges of the circuit board 48, clamp 36 may be unclamped by turning handle 34 counterclockwise as viewed from below, and the handle may be pulled toward the operator or pushed away from the operator to pivot head 28 through an angular sector of approximately 30 degrees governed by slot 38 in clamp bracket 37. By this means the entire motor mounting plate 32 carrying with it central pivotal assembly 90 linked via sprocket wheel 84 connected by chain 97 to sprocket pinion 98 on the shaft of motor 33 operating through a seed reducer 99 to have a seed of 6 revolutions per minute. The internal friction of the motor and speed reducer connected by chain 97 to srocket wheel 84 normally anchors motor 33 and plate 32 to transfer block 42 and component gripping head 28 so that they are moved as a unit by the operator when the head 28 is being lowered into alignment with the component 47 to be removed during the remove component sequence.

When the operator draws handle 34 down to head position 28 in engagement with component 47 overcoming the resistance of pneumatic cylinder 23, he can depress foot switch 114, if the operator notes on the temperature display 106 that the desired head temperatures has been reached. Initiating the oerating cycle, he first depresses and releases the foot switch 114. A brief delay eliminates the effect of switching transients or chattering of contacts. Since the head 28 is down, this automatically actuates the vacuum motor and lights the "vacuum on" indicator light 111, and also energizes the lock brake solenoid; the work ready light 112 is also actuated. When the foot switch is depressed and released for the second time within the 20 second period allowed by an override timer, the timer is reset and the automatic "remove component" sequence of the device begins, with the preheater 49 and its fan being turned on and the preheater timer 107 beginning its cycle. Previous selection of air or compressed gas by operating selector switch 102 determines which of these swill be delivered through the heat transfer head 42, and the program automatically starts the operation of the head timer 108 governing the delivery of compressed air or compressed gas through the heat transfer block 42 and head 28 to the solder terminals of component 47 at the predetermined period of time. Application of heat to the periphery of component 47 through the passages 46 in head 28 rapidly brings the terminals of component 47 to solder-melting temperature.

Torque Motor Sub-Routine

When the predetermined heating period has elapsed, the torque motor sub-routine begins, and motor 33 turns in the direction selected automatically to move component 47 toward its unskewed or aligned position, with its edges parallel to edges of board 48. In its first sub-routine stage, the motor 33 turns the head 28 through a full 15 degree sector whose direction is selected to counteract any initial skewing of component 47. After a 0.2 second interval thereafter, the motor then runs in the reverse direction only until it reaches the zero position in which component 47 is squarely aligned with the edges of board 48.

After reaching the zero position, completing the torque motor sub-routine, the head timer turns off the flow of compressed air or gas and the lock solenoid is de-energized to raise arm 21. The entire moveable assembly thereupon ascends to the top of its track impelled by pneumatic cylinder 23. After the predetermined cooling period has elapsed, determined by the setting of timer 109, the vacuum pump is turned off, dropping the removed component 47 a few inches to board 48, and the beeper signals the operator that the component has been removed. The entire system is then automatically returned to its idle condition ready for the next operation. During the torque motor sub-routine, the reset button is inactivated.

"Replace Component" Secuence

When the operator selects the "replace component" sequence by the operation of switch 101, a similar series of events is achieved by the automatic sequence established in the microcomputer control program through the circuitry of the device.

A new component 47 is first correctly oriented and positioned in head 28 while the head is in its upper position. If the head is not up when the foot switch is depressed and released the first time, the system automatically actuates the beeper signal and returns the device to the beginning of the cycle. If the head is up when the foot switch is depressed and released, the automatic sequence begins. The 20-second timer is activated, and the vacuum is turned on to hold the new component inside the vacuum cup cavity 57 on the bottom of head 28. The 20-second timer allows the oerator time to draw head 28 down through the actuation of handle 34, moving arm 21 and the entire moveable assembly down along rails 19 to bring component 47 into position precisely juxtaposed to the terminal pads on board 48 where it is to be soldered into position.

The second actuation of the foot switch then energizes the lock solenoid actuating brake 116, and turns on the work ready light 112. The third actuation of the foot switch overrides the 20-second timer and activates the preheat cycle, timed by preheat timer 107, and then the heat cycle, timed by timer 108, directing the hot compressed air or gas directly through head 28 to melt the solder on the leads of component 47 and solder it into position on board 48.

After the head timer 108 period elapses, following a delay to allow the solder to cool and solidify, the vacuum is turned off, and ten seconds later the lock solenoid is deactivated, the brake 116 is released and the head automatically rises through the action of pneumatic cylinder 23, while the cooling fan timer 109 governs the cooling period returning the board 48 close to room temperature. Thereafter the beeper signals the operator that the replaced component sequence is completed and the system is automatically returned to its idle condition ready for the next operation.

In both sequences of the device, it will be noted that the externally adjustable head timer 108 governs the concluding steps of the cycle, and that following suitable delays the lock solenoid is de-energized, releasing the brake 116 and allowing arm 121 to carry head 28 to its upper idle position while cooling of board 48 is completed.

Photocells Governino Torque Motor

As indicated in FIG. 8 and particularly in FIG. 8E, in the lower right-hand corner of the flowchart, the torque motor sub-routine allows the reversible motor 33 to turn in either direction when it initiates pivoting movement of head 28 relative to board 48 after the heat cycle has brought the soldered terminal connections of component 47 to solder-melting temperature.

The direction of movement of head 28 is governed by two light-photocell assemblies. The first of these is a direction selector assembly 117 mounted on the underside of clamp bracket 37. The lamp and photocell of the direction selector assembly 117 are arrayed along a radial optic axis extending outward from the central axis of the device, along which light beam 93 is directed and directed radially outward beneath clamp bracket 37 in the direction of its outer slot 38. Positioned for angular movement between the lamp and photocell is an arcuate blade 118 bolted in an upstanding position projecting above the upper surface of arm 32A of the boomerang-shaped motor mounting plate 32, for angular edgewise movement through a slot between the light and photocell of assembly 117, as indicated in the FIGURES.

Blade 118 has an upward extending light-blocking segment 119 extending over the left-hand half of its angular width, and a cutaway segment 120 dimensioned to avoid interfering with the light passing between the lamp and photocell of assembly 117 over its right-hand half. The central step between segments 119 and 120 may be adjustably positioned by angular movement of blade 118, taking advantage of its slotted flanges which are bolted to the upper face of plate 32 to bring the step into alignment with the central radial line of arm 32A of plate 32. This blade 118 is dimensioned to subtend an overall arc of approximately 30 degrees, and each of its segments 119 and 120 thus subtends an arc of about 15 degrees.

The assembly 117 is thus connected to determine the initial direction of rotation of torque motor 33 as indicated in its sub-routine in FIG. 8E. If light blocking segment 119 is interposed to obstruct the signal from assembly 117, torque motor 33 will move to turn chain 97 and rotate sprocket wheel 84 to index head 28 counterclockwise as viewed from above, through an arc of 15 degrees determined by the 1.9 second interval through which the motor is oerated On the other hand if the lower cutaway portion of 120 of blade 118 is positioned juxtaposed to assembly 117, allowing its light beam to pass without interruption and delivering its normal output signal, the motor 33 is started in the opposite direction to index head 28 clockwise is viewed from above through an arc of 15 degrees determined by the 1.9 second interval.

Then, after a 0.1 second interval during which the motor is stopped, the motor direction is automatically reversed and the motor is run in the opposite direction. The second lamp photocell assembly 121 upstanding from the rear arm 32B of motor mounting plate 32 may be called a centering assembly, and it provides a slot between its lamp photocell across its own radial optic axis accommodating a yoke blade 122 mounted directly on the uper surface of sprocket wheel 84, as indicated in FIG. 5. As the sprocket wheel 84 is turned by the movement of motor 33 during its second operation in this reversed direction, yoke blade 122 is moved angularly through the slot in centering assembly 121 until a centering aperture 123 in yoke blade 122 is brought into alignment with the optic axis between the lamp and photocell of assembly 121. The resulting signal from assembly 121 immediately stops motor 33 in its centered position. Thus, at the conclusion of the "remove component" sequence, gripping head 28 is aligned with the edges of its component gripping vacuum aperture parallel to the edges of board 48.

An overall block diagram of the electronic modules and computer which perform the IC removal and replacement according to the present invention is presented in FIG. 7 comprising FIGS. 7A, and 7B. As there seen, a microcomputer 151 receives inputs from various sources including the preheat timer 107, the air blast or head timer 108, the cooling timer 109 and the tool head temperature controller 104 in order that the microcomputer can ascertain the state of external events and the operating parameters desired. Reset switch 110 is used to reset the program executed by the microcomputer 151. Its closure also is sent to a power interrupt detector 152. An air/gas switch 103 provides the microcomputer with information concerning whether air or gas is to be used by the system.

The remove/replace selector switch 101 provides information to the microcomputer with respect to whether the system is to remove an integrated circuit component 47 or is to replace a new integrated circuit component 47. The head down switch 165 is an optical or mechanical sensing switch which provides information concerning the down position of the head 28 to the microcomputer, while foot switch 114 indicates to the microcomputer when the operator's foot switch is depressed. Optical switches 169 and 170 in assemblies 121 and 117 respectively indicate to the microcomputer the presence of center mark aperture 123 and the desired direction of rotation for the torque motor system.

Microcomputer 151 contains internal memory for the storage of microcomputer instructions which perform the functions set forth in the overall flowchart comprising FIG. 8. A source listing of the macro assembler instructions for execution by an INTEL 8748 type microcomputer after compilation is presented in Table 1. As seen in Table 1, the first page identifies the inputs discussed above as well as the output signals generated by microcomputer 151 under instructions set forth in the remainder of Table 1. Pages 2 and 3 of Table 1 identify the memory locations of various variables (the equates portion) as well as various routines to perform functions which are called upon by the main body of the program (such as a jump idle routine, a jump reset routine, a software timer interrupt vector routine, etc.). Pages 4 and 5 (lines 138 through 206) set forth the overall routine for performing the removal of an integrated circuit form a surface mounted circuit board while pages 5 through 7 (lines 207-287) set forth the overall procedure used to instruct the torque motor to dislodge an integrated circuit from a surface mounted printed circuit board.

TABLE 1

ISIS-II MCS-48/UPI-41 MACRO ASSEMBLER, V4.2

```
LOC  OBJ      LINE        SOURCE STATEMENT
                1
                2 ; S . T . A . R .            1/27/86 . UPDATE 1/29/86
                3 ;                                      UPDATE 2/17/86 (MCS'S)
                4
                5 ;(OUTPUTS)
                6 ;         D90     N/C
                7 ;         D91     N/C
                8 ;         D92     N/C
                9 ;         D93     N/C
               10 ;         D94     AIR COMPRESSOR          0=ON
               11 ;         D85     PREHEATER FAN           0=ON
               12 ;         D86     PREHEATER               0=ON
               13 ;         D87     GAS VALVE               0=ON
               14
               15 ;         P1.0    VACUUM & LED            0=ON
               16 ;         P1.1    WORK RDY SEL            0=ON
               17 ;         P1.2    WORK COMPLETE           0=ON=BEEP
               18 ;         P1.3    START HEATING HEAD      0=START/0=RESET (HOLD AT 0)
               19 ;         P1.4    TORQUE MOTOR CCW        0=ON
               20 ;         P1.5    TORQUE MOTOR CW         0=ON
               21 ;         P1.6    START COOLING TIMER     0=START/1=RESET (HOLD AT 0)
               22 ;         P1.7    START PREHEATER TIMER   0=START/1=RESET (HOLD AT 0)
               23
               24 ;(INPUTS)
               25 ;         P2.0    HEAT TEMP READY         0=READY
               26 ;         P2.1    DIRRECTION              0=CW/1=CCW
               27 ;         P2.2    CENTER (ZERO) POSITION  0=ZERO
               28 ;         P2.3    AIR/GAS                 1=AIR/0=GAS
               29 ;         P2.4    REMOVE/REPLACE          1=REMOVE/0=REPLACE
               30 ;         P2.5    HEATING HEAD TIMEOUT    1=TIMEOUT
               31 ;         P2.6    COOLING TIMEOUT         1=TIMEOUT
               32 ;         P2.7    PREHEATER TIMEOUT       1=TIMEOUT
               33
               34 ;         T0      FOOT SWITCH             0=DEPRESSED (NO)
               35 ;         T1      HEAD UP/DOWN            0=DOWN/1=UP
               36
               37 $EJECT
LOC  OBJ      LINE        SOURCE STATEMENT 38
               39 ;         EQUATES
               40
0010           41 AIR       EQU     10H     ;D84
0020           42 FAN       EQU     20H     ;D85
0040           43 HEATER    EQU     40H     ;D86
0080           44 GAS       EQU     80H     ;D87
               45
00FE           46 VACUUM    EQU     0FEH    ;P1.0
00FD           47 LOCK      EQU     0FDH    ;P1.1
00FB           48 BEEPER    EQU     0FBH    ;P1.2
00F7           49 STRTHH    EQU     0F7H    ;P1.3
00EF           50 CCWMTR    EQU     0EFH    ;P1.4
00DF           51 CWMTR     EQU     0DFH    ;P1.5
00BF           52 STRTCL    EQU     0BFH    ;P1.6
007F           53 STRTPT    EQU     07FH    ;P1.7
```

```
-006B           54 TIMVAL  EQU    256-149 ;AT 3.5759 MHZ CLOCK = 20 MILLI SEC TIMEOUT
                55
0000            56 ORG 00
0000 040A       57 SORG:   JMP IDLE       ;GO TO IDLE ROUTINE
                58
0003            59 ORG 03
                60
0003 247F       61         JMP RESET      ;GO TO RESET ROUTINE THEN TO IDLE
                62
0007            63 ORG 07
                64
0007 2495       65         JMP STIMER     ;SOFTWARE TIMER INT VECTOR
                66
000A            67 ORG 10
                68
                69 IDLE:   ;SET UP PORTS AT POR FOR IDLE STATE
                70
000A 23FF       71         MOV A,#0FFH
000C 02         72         OUTL BUS,A     ;AIR GAS FAN PREHEATER ALL OFF
000D 23FF       73         MOV A,#0FFH    ;VAC LOCK BEEPER TORQUE MOTOR = OFF
                74                        ;ALL TIMERS IN RESET MODE
000F 39         75         OUTL P1,A      ;NOW
0010 23FF       76         MOV A,#0FFH
0012 3A         77         OUTL P2,A      ;ALL INPUTS IN INPUT MODE
                78
0013 65         79         STOP TCNT      ;STOP TIMER COUNTER
0014 35         80         DIS TCNTI      ;DISABLE TIMER INT
                81
                82 ; DO AUTO ZERO NOW
                83
0015 0A         84         IN A,P2        ;READ P2 INPUTS
0016 521A       85         JB2 NOTZRO     ;IF CENTER <> 0 THEN DO ZERO ROUTINE
0018 0440       86         JMP EXIDLE     ;IF CENTER = 0 THEN EXIT
                87
001A 231E       88 NOTZRO: MOV A,#30
001C 34AC       89         CALL SETIME    ;ENABLE SOFTWARE TIMER FOR 3 SEC'S
                90
001E 999F       91         ANL P1,#CWMTR  ;TURN MOTOR ON CW
                92
LOC  OBJ        LINE       SOURCE STATEMENT 0020 7627       93 ZROLP1: JF1 CWTOUT     ;CHECK FOR TIMEOUT (3 SEC)
0022 0A         94         IN A,P2
0023 5220       95         JB2 ZROLP1     ;ALSO CHECK FOR ZERO = 0 IF NOT TRY AGAIN
                96
0025 0430       97         JMP ZEROIT     ;IF HERE WE HAVE ZERO=0 SO EXIT
                98
                99 CWTOUT: ;CW 3 SEC HAS TIMED OUT SO REVERSE AND TRY FOR 6 SEC
                100
0027 23FF       101        MOV A,#0FFH
0029 39         102        OUTL P1,A      ;TURN OFF MOTOR
                103
002A 2301       104        MOV A,#01
002C 34AC       105        CALL SETIME
002E 7632       106 XWAIT: JF1 CWTEST
0030 042E       107        JMP XWAIT      ;WAIT FOR .1 SEC TIMEOUT
                108
0032 2330       109 CWTEST: MOV A,#60
0034 34AC       110        CALL SETIME    ;SET UP 6 SEC TIMEOUT
```

```
0036 99EF       111           ANL P1,#CCWMTR   ;TURN MOTOR ON CCW
                112
0038 7638       113 ZROLP2:   JF1 CCWOUT       ;IF TIMEOUT OCCURS GO TO CCWOUT
003A 0A         114           IN A,P2
003B 523B       115           JB2 ZROLP2       ;WAIT FOR ZERO=0
                116
                117 CCWOUT: ;WE ARE NOT DOING ANYTHING IF WE CAN'T AUTO ZERO SO NULL
                118 ZEROIT:
003D 23FF       119           MOV A,#0FFH
003F 39         120           OUTL P1,A        ;TURN OFF MOTOR
                121
0040 05         122 EXIDLE:  EN I              ;RESET INTURRUPT IS ENABLED
                123
0041 0A         124 HEADRY:  IN A,P2
0042 1241       125           JB0 HEADRY       ;WAIT FOR HEAD TEMP TO BE OK
                126
0044 5411       127           CALL HALF        ;.5 SEC DELAY
0046 0A         128           IN A,P2
0047 1241       129           JB0 HEADRY       ;RETEST HARD TEMP TEMP IF OK CONTINUE
                130
0049 5400       131 XFOOT:   CALL FOOTON       ;GO GET 1 TO 0 ON FOOT SWITCH (NOT TIMED)
                132
004B 0A         133           IN A,P2
004C 9254       134           JB4 REMOVE       ;MODE 1 SWITCH = 1 SO REMOVE ROUTINE
004E 2404       135           JMP REPLAC       ;MODE 1 SWITCH = 0 SO REPLACE ROUTINE
                136
                137 $EJECT

LOC  OBJ        LINE          SOURCE STATEMENT 138
                139 ;***********************************************
                140 ;
                141 ;     R E M O V E
                142 ;
                143 ;***********************************************
0050 3401       144 XREM:    CALL BEEPIT       ;.5 SEC BEEP (ERROR INDICATOR)
0052 0449       145           JMP XFOOT
                146
0054 5650       147 REMOVE:  JT1 XREM          ;IF HEAD IS DOWN GO TO FOOT SWITCH
                148
0056 99FD       149           ANL P1,#LOCK     ;TURN ON LOCK SEL
0058 5411       150           CALL HALF        ;HALF SEC DELAY
005A 99FE       151           ANL P1,#VACUUM   ;TURN ON VACUUM & LED
                152
005C 23C8       153           MOV A,#200
005E 34AC       154           CALL SETIME      ;SET UP 20 SEC TIMEOUT
0060 5418       155           CALL TIMFOT      ;GO TO TIMED FOOT SWITCH ROUTINE
                156                            ;IF F1=1 ON RETURN THEN TIMEOUT HAS OCCURED
0062 7666       157           JF1 TOIDLE       ;IF F1=1 GO TO IDLE
0064 0468       158           JMP CONTR
                159
0066 040A       160 TOIDLE:  JMP IDLE          ;RETURN TO IDLE ROUTINE
                161
                162 ;FOOT SWITCH HAS BEEN HIT A SECOND TIME SO DO THE FOLLOWING:
                163 ;    1. TURN ON FAN PREHEATER AND PREHEATER TIMER
                164
0068 2360       165 CONTR:   MOV A,#FAN + HEATER ;TURN ON FAN AND HEATER
006A 37         166           CPL A            ;INVERT FOR NEG TRUE LOGIC
```

```
006B 02        167         OUTL BUS,A           ;NOW!
006C 997F      168         ANL P1,#STRTPT       ;START PREHEATER TIMER
               169
006E 0A        170 FHWAIT: IN A,F2
006F 37        171         CPL A
0070 F26E      172         JB7 FHWAIT           ;WAIT FOR PREHEAT TIMEOUT
               173
               174 ;WE GOT TIMEOUT OF PREHEATER
               175
0072 0A        176         IN A,F2
0073 37        177         CPL A
0074 F26E      178         JB7 FHWAIT           ;RECHECK PREHEAT TIMEOUT (NOISE DEBOUNCE)
               179
0076 89B0      180 FHOK:   ORL P1,#80H          ;RESET PREHEAT TIMER
               181
               182 ;NOW CHECK FOR GAS OR AIR
               183
0078 0A        184         IN A,P2
0079 727F      185         JB3 ISAIR            ;IF AIR/GAS = 1 THEN ITS AIR
               186
007B 23E0      187         MOV A,#FAN + HEATER + GAS ;TURN ON GAS BIT WITH FAN AND PREHEAT
007D 0481      188         JMP MODE2
               189
007F 2370      190 ISAIR:  MOV A,#FAN + HEATER + AIR ;TURN ON AIR BIT WITH FAN AND PREHEAT
               191
0081 37        192 MODE2:  CPL A
LOC  OBJ       LINE        SOURCE STATEMENT 0082 02        193         OUTL BUS,A           ;TURN ON AIR OR GAS WITH FAN AND PREHEATER
               194
0083 99F7      195         ANL P1,#STRTHH       ;START HEAD TIMER TIMEOUT
               196
0085 0A        197 HDWAIT: IN A,P2
0086 37        198         CPL A
0087 B265      199         JB5 HDWAIT           ;WAIT FOR HEAD HEATING TO TIMEOUT
               200
0089 0A        201         IN A,P2
008A 37        202         CPL A
008B B265      203         JB5 HDWAIT           ;RECHECK FOR HEAD HEATING TIMEOUT (NOISE DEBOUNCE)
               204
008D 8908      205 ONHEAD: ORL P1,#08H          ;RESET HEAD TIMER
               206
               207 ;************************
               208 ;
               209 ; TORQUE   ROUTINE
               210 ;
               211 ;************************
               212
008F 15        213 TORQUE: DIS I                ;TURN OFF RESET INPUT
0090 0A        214         IN A,P2
0091 3299      215         JB1 MVCCW            ;IF DIRECTION = 1 THEN GO CCW FIRST
0093 990F      216 MVCW:   ANL P1,#CWMTR        ;TURN ON TORQUE MOTOR CW
0095 BBEF      217         MOV R3,#CCWMTR       ;SAVE REVERSE DIRECTION IN R3
0097 049D      218         JMP XXXT
               219
0099 99EF      220 MVCCW:  ANL P1,#CCWMTR       ;TURN ON TORQUE MOTOR CCW
009B BB0F      221         MOV R3,#CWMTR        ;SAVE REVERSE DIRECTION IN R3
               222
```

```
009D 2313    223 XNXT:   MOV A,#19
009F 34AC    224         CALL SETIME   ;SET TIMEOUT TO 1.9 SEC
             225
00A1 76A5    226 WAIT19: JF1 REVIT     ;WHEN F1=1 THEN REVERSE MOTOR
00A3 04A1    227         JMP WAIT19    ;WAIT FOR TIMEOUT
             228
00A5 8930    229 REVIT:  ORL P1,#030H  ;TURN OFF MOTOR DIRECTION (NOTHING ELSE)
             230
00A7 2301    231         MOV A,#01
00A9 34AC    232         CALL SETIME   ;SET UP .1 SEC TIMEOUT
00AB 76AF    233 OFWAIT: JF1 OFFOK
00AD 04AB    234         JMP OFWAIT    ;WAIT .1 SEC
             235
             236 OFFOK:  ;NOW FLIP MOTOR DIRECTION
             237
00AF 09      238         IN A,P1       ;READ OUTPUT PORTS
00B0 53      239         ANL A,#3      ;AND IN REVERSE MOTOR DIRECTION
00B1 39      240         OUTL P1,A     ;REVERSE MOTOR NOW
             241
00B2 0A      242 NOTCTR: IN A,P2
00B3 52B2    243         JB2 NOTCTR    ;WAIT FOR HEAD TO BE CENTERED
00B5 0A      244         IN A,P2
00B6 52B2    245         JB2 NOTCTR    ;RECHECK HEAD CENTER
             246
00B8 8930    247         ORL P1,#030H  ;TURN OFF MOTOR NOW
LOC  OBJ     LINE        SOURCE STATEMENT 248
             249 ;TURN OFF GAS OR AIR AND PREHEATER AND LOCK SEL
             250
00BA 2320    251         MOV A,#FAN
00BC 37      252         CPL A
00BD 02      253         OUTL BUS,A    ;FAN IS ON/AIR GAS PREHEATER ARE OFF
00BE 8902    254         ORL P1,#02H   ;LOCK SEL OFF
             255
00C0 05      256         EN I          ;REENABLE RESET INTERRUPT NOW !
             257
00C1 2314    258         MOV A,#20
00C3 34AC    259         CALL SETIME   ;2 SEC TIMEOUT
             260
00C5 76C9    261 TWOSEC: JF1 SEC2ON
00C7 04C5    262         JMP TWOSEC    ;WAIT FOR 2 SEC TIMEOUT
             263
00C9 8901    264 SEC2ON: ORL P1,#01H   ;TURN OFF VACUUM
00CB 993F    265         ANL P1,#STRTCL ;TURN ON COOLING TIMER
             266
00CD 0A      267 WAITCL: IN A,P2
00CE 37      268         CPL A
00CF D2CD    269         JB6 WAITCL    ;WAIT FOR COOLING TIMEOUT
             270
00D1 0A      271         IN A,P2
00D2 37      272         CPL A
00D3 D2CD    273         JB6 WAITCL    ;RECHECK COOLING TIMEOUT (NOISE BOUNCE)
             274
00D5 23FF    275 COOLIT: MOV A,#0FFH
00D7 02      276         OUTL BUS,A    ;TURN OFF FAN
             277
00D8 8940    278         ORL P1,#40H   ;TURN OFF COOLING TIMER
             279
```

```
00DA 346B      280          CALL BEEP4     ;BEEP 4 TIMES
               281
00DC 040A      282          JMP IDLE       ;ALL DONE !!!!!
               283
               284 $EJECT
LOC  OBJ       LINE         SOURCE STATEMENT 285
0100           286 ORG 100H
               287
               288 ;********************************
               289 ;
               290 ;   R E P L A C E   R O U T I N E
               291 ;
               292 ;********************************
               293
0100 3401      294 XREP:    CALL BEEPIT    ;.5 SEC BEEP (ERROR INDICATOR)
0102 0449      295          JMP XFOOT
0104 4600      296 REPLAC:  JNT1 XREP      ;IF HEAD IS DOWN THEN GO TO FOOT SWITCH ROUTINE
               297
0106 99FE      298          ANL P1,#VACUUM ;TURN ON VACUUM NOW
               299
0108 23C8      300          MOV A,#200
010A 34AC      301          CALL SETIME    ;SET UP 20 SEC TIMEOUT
               302
               303 ; NOTE: WE MUST HAVE ARM DOWN AND FOOT SWITCH DEPRESSED BEFORE 20 SEC TIMEOUT
               304
010C 7616      305 ARMUP:   JF1 BKIDLE
010E 560C      306          JT1 ARMUP      ;WAIT FOR ARM DOWN OR TIMEOUT
               307
0110 5415      308 AOK:     CALL TIMFOT    ;WAIT FOR TIMEOUT OR FOOTSWITCH
               309
0112 7616      310          JF1 BKIDLE
0114 2418      311          JMP OK2
               312
0116 040A      313 BKIDLE:  JMP IDLE       ;WE TIMED OUT SO QUIT
               314
               315 ;2 ND FOOTSWITCH AND HEAD DOWN OK SO CONTINUE
               316
0118 99FD      317 OK2:     ANL P1,#LOCK   ;TURN ON LOCK SEL
               318
011A 23C8      319          MOV A,#200
011C 34AC      320          CALL SETIME    ;SET UP 20 SEC TIMEOUT
               321
011E 5415      322          CALL TIMFOT    ;WAIT FOR FOOT SWITCH OR 20 SEC TIMEOUT
               323
0120 7624      324          JF1 GOIDLE     ;GO TO IDLE IF TIMEOUT
0122 2426      325          JMP OK3RD
               326
0124 040A      327 GOIDLE:  JMP IDLE       ;TIME OUT HAS OCCURED
               328
               329 ;TURN ON FAN PREHEATER AND PREHEATER TIMER
               330
0126 2360      331 OK3RD:   MOV A,#FAN + HEATER
0128 37        332          CPL A
0129 02        333          OUTL BUS,A     ;TURN ON FAN AND PREHEATER NOW
               334
012A 99FF      335          ANL P1,#STRTPT ;TURN ON PREHEATER TIMER
               336
```

```
0126 0A        337 WAITPH: IN A,P2
0129 37        338         CPL A
012E F22C      339         JB7 WAITPH      ;WAIT FOR PREHEATER TIMEOUT
LOC OBJ        LINE        SOURCE STATEMENT 340
0130 0A        341         IN A,P2
0131 37        342         CPL A
0132 F22C      343         JB7 WAITPH      ;RECHECK PREHEATER TIMEOUT(DEBOUNCE)
               344
0134 5980      345         ORL P1,#80H     ;RESET PREHEAT TIMER
               346
0136 BA70      347         MOV R2,#FAN + HEATER + AIR
0138 0A        348         IN A,P2
0139 723D      349         JB3 ITSAIR
               350
013B BAE0      351         MOV R2,#FAN + HEATER + GAS
               352
013D FA        353 ITSAIR: MOV A,R2         ;GET FAN HEATER AND (AIR OR GAS)
013E 37        354         CPL A
013F 02        355         OUTL BUS,A       ;TURN THEM ON NOW !
               356
0140 99F7      357         ANL P1,#STRTHH   ;START HEAD TIMER NOW
               358
0142 0A        359 WAITHD: IN A,P2
0143 37        360         CPL A
0144 B242      361         JB5 WAITHD       ;WAIT FOR HEAD HEATING TIMEOUT
               362
0146 0A        363         IN A,P2
0147 37        364         CPL A
0148 B242      365         JB5 WAITHD       ;RECHECK HEAD HEATING TIMEOUT (NOISE)
               366
014A 8908      367         ORL P1,#08H      ;RESET HEAD HEATER TIMER
               368
014C 2314      369         MOV A,#20
014E 34AC      370         CALL SETIME      ;SET UP 2 SEC TIMEOUT
               371
0150 7654      372 WAIT2:  JF1 DONE2
0152 2450      373         JMP WAIT2        ;WAIT FOR 2 SEC TIMEOUT
               374
               375 ;TURN OFF AIR/GAS/PREHEATER
               376
0154 2320      377 DONE2:  MOV A,#FAN
0156 37        378         CPL A
0157 02        379         OUTL BUS,A       ;TURN OFF ALL BUT FAN NOW !
               380
0158 2314      381         MOV A,#20
015A 34AC      382         CALL SETIME      ;ANOTHER 2 SEC DELAY
               383
015C 7660      384 WAIT3:  JF1 DONE3
015E 245C      385         JMP WAIT3        ;WAIT FOR 2 SEC
               386
0160 8901      387 DONE3:  ORL P1,#01H      ;TURN OFF VACUUM NOW
0162 2364      388         MOV A,#100
0164 34AC      389         CALL SETIME      ;SET UP 10 SEC TIMEOUT
               390
```

```
0166 766A        391 WAIT10: JF1 DONE10
0168 2466        392         JMP WAIT10      ;WAIT FOR 10 SEC TIMEOUT
                 393
016A 8902        394 DONE10: ORL P1,#02H     ;TURN OFF LOCK SEL
LOC  OBJ         LINE        SOURCE STATEMENT 016C 995F        395         ANL P1,#STRTCL  ;TURN ON COOLING TIMER
                 396
016E 0A          397 WAITCO: IN A,P2
016F 37          398         CPL A
0170 D26E        399         JB6 WAITCO      ;WAIT FOR COOLING TIMEOUT
                 400
0172 0A          401         IN A,P2
0173 37          402         CPL A
0174 D26E        403         JB6 WAITCO      ;RECHECK
                 404
0176 23FF        405         MOV A,#0FFH
0178 02          406         OUTL BUS,A      ;TURN OFF FAN
                 407
0179 8940        408         ORL P1,#40H     ;TURN OFF COOLING TIMER
                 409
017B 34B8        410         CALL BEEP4      ;BEEPER 4 TIMES
                 411
017D 040A        412         JMP IDLE        ;ALL DONE !!
                 413
                 414 $EJECT
LOC  OBJ         LINE        SOURCE STATEMENT 415
                 416
                 417 ;****************************************
                 418 ;
                 419 ; INTERRUPT ROUTINES
                 420 ;
                 421 ;****************************************
                 422
017F 15          423 RESET:  DIS I           ;DISABLE RESET INT (IDLE WILL REARM)
0180 65          424         STOP TCNT       ;KILL TIMER IF RUNNING
0181 35          425         DIS TCNTI       ;KILL TIMER INT
0182 2300        426         MOV A,#00
0184 D7          427         MOV PSW,A       ;RESET STACK TOP
0185 349A        428         CALL DUMMY
                 429
                 430 ;NOW CHECK FOR LOCK SEL TO BE ACTIVE
                 431
0187 09          432         IN A,P1         ;READ OUTPUTS
0188 1299        433         JB0 NOVAC       ;IF VACUUM IS OFF OK TO EXIT
018A 23FF        434         MOV A,#0FFH
018C 02          435         OUTL BUS,A      ;TURN OFF AIR/GAS/FAN/PREHEATER
018D 23FD        436         MOV A,#0FDH    ;TURN OFF ALL BUT LOCK SEL
018F 39          437         OUTL P1,A       ;NOW !
0190 2364        438         MOV A,#100
0192 34AC        439         CALL SETIME     ;DELAY 10 SEC
                 440
0194 7698        441 REWAIT: JF1 NOVAC       ;WAIT FOR 10 SEC TIMEOUT
0196 2494        442         JMP REWAIT      ;CONTINUE TO WAIT
                 443
0198 040A        444 NOVAC:  JMP IDLE
                 445
```

```
019A 93        446 DUMMY:   RETR             ;USED TO REARM EXTERNAL INTERRUPT
               447
               448
               449 ; TIMER INTERRUPT SERVICE ROUTINE
               450 ;ROUTINE USES R4 AND R5 OF REGISTER BANK 1 WHICH MUST STAY INTACT
               451
               452 ;SET UP THIS ROUTINE BY CALLING SETIME PASS 1 COUNT IN ACC FOR EVERY .1 SEC
               453
               454 ;IE ACC=19 = 1.9 SEC
               455
               456
019B D5        457 STIMER:  SEL RB1          ;SELECT RB1
019C AE        458          MOV R6,A         ;SAVE ACC IN R6
019D 236B      459          MOV A,#TIMVAL
019F 62        460          MOV T,A          ;RESET TIMER TO 20 MILLI SEC
               461
01A0 EDAA      462          DJNZ R5,EXITST
01A2 BD05      463          MOV R5,#05       ;R5 = 5 * 20 MILLI SEC = .1 SEC
               464
01A4 ECAA      465          DJNZ R4,EXITST   ;IF R4 # OF .1 SEC <> 0 THEN KEEP COUNTING
               466
               467 ;SET TIME HAS TIMED OUT SO*
               468
01A6 A5        469          CLR F1           ;F1=0
LOC  OBJ       LINE         SOURCE STATEMENT

01A7 B5        470          CPL F1           ;F1=1
01A8 65        471          STOP TCNT        ;STOP TIMER
01A9 35        472          DIS TCNTI        ;DISABLE TIMER INT
01AA FE        473 EXITST:  MOV A,R6         ;RESTORE ACC FROM R6
01AB 93        474          RETR             ;RETURN FROM PROCEDURE (RB0 WILL BE RESET ON RETURN)
               475
               476 $EJECT

LOC  OBJ       LINE         SOURCE STATEMENT 477
               478 ; S U B R O U T I N E S
               479
01AC D5        480 SETIME:  SEL RB1
01AD AC        481          MOV R4,A         ;SAVE .1 SEC COUNTS IN RB1 R4
01AE BD05      482          MOV R5,#05       ;5 * 20 MILLI SEC = .1 SEC
01B0 236B      483          MOV A,#TIMVAL    ;TIMER=149=20 MILLI SEC AT 3.5759 MHZ
01B2 62        484          MOV T,A          ;LOAD TIMER
01B3 A5        485          CLR F1           ;FLAG 1 = 0
01B4 C5        486          SEL RB0          ;BACK TO RB0
01B5 25        487          EN TCNTI         ;ENABLE TIMER INTERRUPT
01B6 55        488          STRT T           ;START TIMER
01B7 83        489          RET
               490
               491 ; ROUTINE BEEPS 4 TIMES .5 SEC ON / .5 SEC OFF
               492
01B8 BB04      493 BEEP4:   MOV R3,#04       ;4 BEEPS
01BA 99FB      494 BEEP2:   ANL P1,#BEEPER   ;TURN BEEPER ON
01BC 2305      495          MOV A,#05
01BE 34AC      496          CALL SETIME      ;.5 SEC BEEP
01C0 76C0      497 BEEP5:   JF1 OFFTM
01C2 24C0      498          JMP BEEP5        ;WAIT FOR .5 SEC
               499
01C4 8904      500 OFFTM:   ORL P1,#04H      ;BEEPER OFF
```

```
01C6 2305       501         MOV A,#05
01C8 34AC       502         CALL SETIME    ;.5 SEC TIMEOUT
01CA 76CE       503 BEEP6:  JF1 NEXTBP
01CC 24CA       504         JMP BEEP6      ;WAIT FOR .5 SEC
                505
01CE EBBA       506 NEXTBP: DJNZ R3,BEEP2  ;DO IT 4 TIMES
01D0 83         507         RET
                508
                509
                510
01D1 99FB       511 BEEPIT: ANL P1,#BEEPER ;TURN BEEPER ON FOR .5 SEC
01D3 2305       512         MOV A,#05
01D5 34AC       513         CALL SETIME    ;.5 SEC TIMEOUT
01D7 76DB       514 BEEPB:  JF1 BEEPEX     ;WAIT FOR TIMEOUT TO COMPLETE
01D9 24D7       515         JMP BEEPB
                516
01DB 8904       517 BEEPEX: ORL P1,#04H    ;TURN BEEPER OFF
01DD 83         518         RET
                519
                520 $EJECT
LOC  OBJ        LINE        SOURCE STATEMENT 521
0200            522         ORG 200H
                523
                524 ;WAIT FOR FOOT SWITCH TO BE UP THEN DOWN THEN UP
                525
0200 2600       526 FOOT1N: JNT0 FOOT1N    ;WAIT FOR FOOTSWITCH TO BE UP (1)
0202 540D       527         CALL TENTH
0204 2600       528         JNT0 FOOT1N    ;CHECK AGAIN (.1 SEC DEBOUNCE)
                529
0206 3606       530 FOOT2:  JT0 FOOT2      ;WAIT FOR FOOT SWITCH TO BE DEPRESSED (0)
0208 540D       531         CALL TENTH
020A 3606       532         JT0 FOOT2      ;.1 SEC DEBOUNCE
                533
020C 83         534         RET
                535
                536 ; .1 SEC SOFTWARE DELAY
                537
020D BE1F       538 TENTH:  MOV R6,#31     ;31 * 256 * 3 * 4.2 MICRO SEC
020F 4413       539         JMP HALF2
                540
                541 ; .5 SEC SOFTWARE DELAY (QUICKER THAN SETTING UP SETIME)
                542
0211 BE9C       543 HALF:   MOV R6,#156    ;156 * 256 * 3 * 4.2 MICRO SEC
0213 BF00       544 HALF2:  MOV R7,#00
0215 00         545 HALF1:  NOP
0216 EF15       546         DJNZ R7,HALF1
0218 EE13       547         DJNZ R6,HALF2
021A 83         548         RET
                549
                550
                551
                552 ;FOOTSWITCH VERSES TIMEOUT
                553 ;ON RETURN IF F1=0 THEN FOOTSWITCH BEFORE TIMEOUT
                554 ;ON RETURN IF F1=1 THEN TIMEOUT BEFORE FOOTSWITCH
                555
```

```
021B 762E        556 TIMFOT: JF1 TIMOUT    ;IF F1=1 THEN QUIT AND RETURN F1=1
021D 2615        557         JNT0 TIMFOT
021F 540D        558         CALL TENTH
0221 2618        559         JNT0 TIMFOT   ;WAIT FOR F S UP
0223 762E        560 FT2:    JF1 TIMOUT
0225 3623        561         JT0 FT2
0227 540D        562         CALL TENTH
0229 3623        563         JT0 FT2       ;WAIT FOR F/S DOWN
                 564
022B 35          565         DIS TCNTI     ;KILL TIMER INTERRUPT
022C 65          566         STOP TCNT     ;STOP TIMER
022D A5          567         CLR F1        ;INSURE F1=0 FOOTSWITCH OK
022E 83          568 TIMOUT: RET
                 569
                 570
                 571 END
```

```
USER SYMBOLS
AIR   0015   ACK   0110   ARMUP 010C   BEEP2 01BA   BEEP4 01B9   BEEP5 01C9   BEEP6 01CA   BEEP8 01D7
BEEPER 00FB  BEEPEX 01DB  BEEPIT 01D1  BXIDLE 0116  CCWHTR 00EF  CCWOUT 0030  CONTR  0043  COOLIT 00B5
CHMTR 00EF   CHTEST 0032  CWTOUT 0027  DONE1C 016A  DONE2 0154   DONE3 0160   DUMMY  015A  EXIDLE 0040
EXITST 01AA  FAN   0020   F00T2 0206   FOOTDN 0200  FT2   0223   GAS   0060   GOGO   0000  GOIDLE 0124
HALF  0211   HALF1 0215   HALF2 0213   HDWAIT 0085  HEARV 0041   HEATER 0040  IDLE   003A  ISAIR  007F
ITSAIR 013D  LOCK  00FD   MODE2 0081   MVCCW 0059   MVCW  0093   NEXTBF 01CE  NOTCTR 0052  NOTZRO 001A
NOVAC 0198   OFFON 00AF   OFFTM 01C4   OFWAIT 00AB  ON2   0118   ON3RD 0126   OKHEAD 0089  PHOK   0076
PHWAIT 006E  REMOVE 0054  REPLAC 0104  RESET 017F   REVIT 0045   REWAIT 0194  SEC2IN 00C9  SETIME 01AC
STIMER 0198  STRTCL 006F  STRTHM 00F7  STRTPT 007F  TENTH 0200   TIMFOT 021B  TIMOUT 022E  TIMVAL 0069
TOIDLE 0066  TORQUE 006F  TWOSEC 00C5  VACUUM 00FE  WAIT10 0166  WAIT19 00A1  WAIT2  0150  WAIT3  015C
WAITCL 00CD  WAITCO 016E  WAITHD 0142  WAITPH 012C  XFOOT 0049   XNXT  0090   XREM   0050  XREP   0100
XWAIT 002E   ZEROIT 003D  ZROLP1 0020  ZROLF2 003B

ASSEMBLY COMPLETE,  NO ERRORS
```

The overall routine for replacing an integrated circuit is presented at pages 7 through 9 of Table 1 (lines 268-414), while various interrupt routines are presented at pages 10 and 11 (lines 415-476) which, as is well known in the art, provides for certain external events to interrupt the execution of the program so as to cause it to jump to a designated location in order to perform a particular routine. Such interrupts are well known in the microcomputer art. One such interrupt operates when the reset switch 110 is closed, causing an input to be sent to the microcomputer, thereby activating the reset routine as set forth at lines 423-446. It is important that such external events cause an immediate interruption of the normal operation of the system so as to halt a given procedure when some external event occurs such as pressing the reset switch.

The remainder of Table 1 presents various sub-routines and user symbols which form the remainder of the computer program implemented by microcomputer 151.

As further seen in FIG. 7, the microcomputer generates output signals while executing the program set forth in Table 1. These signals are presented to hardware devices for causing particular actions to occur at particular times in order to complete the operation of the system as set forth in the flowchart presented in FIGURE 8. Thus, the "clockwise and counterclockwise torque" output signals are presented to the torque motor drive module 172 which in turn provides the direct control to torque motor 33.

The "vacuum on" signal from microcomputer 151 is presented to a buffer 175 which in turn controls the operation of a triac motor relay 176. A low output state of buffer 175 indicates a high output with respect to the "vacuum on" signal and causes current to flow through light emitting diode 111 thereby indicating to the operator that a "vacuum on" state is present. Conversely when the preheater signal is low, current flows through light emitting diode 113 indicating that a heat cycle is in process. The preheater signal, when high, prevents light emitting diode 113 from activating, while simultaneously causing gate 180 to activate the triac heater relay 181 which in turn controls heaters 39.

The "work complete" signal is also presented to a buffer 184 for activating a beeper 186 signaling the completion of a work cycle.

The "gas valve" signal is connected to a solenoid driver module 188 so as to control activation of a gas valve 190. The "head lock down" signal is presented to gate 192 which in turn controls a solenoid within the solenoid driver module 188 for controlling a remote brake lock 194. Gate 192 also controls light emitting diode 112 so as to indicate a work ready status when a head locked down state is present.

The "compressor enable" signal is presented to gate 196 which in turn controls the activation of triac motor relay 298 which in turn controls the compressor 200.

The "preheat fan" signal is presented to gate 202 which in turn controls the activation of a triac motor relay 204 which in turn controls the operation of fan motor 206.

The "start preheat timer" signal controls the activation of preheat timer 107 while the "start head timer" signal controls the activation of air blast or head timer 108. Finally, the "start cooling timer" signal controls the activation of cooling timer 109.

It is therefore readily apparent that the microcomputer 151 when executing the compiled instructions of the program instructions set forth in Table 1 is able to interpret the various input information from the external timers, sensors and switches so as to provide the desired removal or replacement of an integrated circuit which is surface mounted to a printed circuit board, all in accordance with the techniques explained earlier and as presented in the flowchart shown in FIG. 8.

The angular pivoting movement of head 28 initiated by the torque motor sub-routine applies the torque to component 47 tending to twist it relative to board 48 and shearing any adhesive tending to secure it to the board. The system may be designed to apply this initial torque with a slow twisting motion. Alternatively, the system may instead be designed to apply this initial torque with a rotary "impact" motion, applying a sudden shock load in a twisting direction to component 47, if this is required to shear such adhesive. Finally, a reciprocating angular "wobbling" motion may be produced, alternately torquing component 47 clockwise and counterclockwise through a small angular sector if desired.

The advantage of the torquing systems of the present invention lies in the elimination of wedging or prying tools, which conventional techniques require to be inserted between the component and the board with the unavoidable result of bending or damaging the terminal leads of the component or the terminal pads of the board.

The same sub-routine is followed by torque motor 33 when the unit is first turned on, positioning head 28 in parallel alignment with the edges of board 48 before either operating sequence begins, subject to the operator's maneuvering of clamp 36 before initiating the "remove component" sequence.

Thus the removal of any desired component 47 from board 48 is readily achieved by the methods and apparatus of the present invention. Quickly and automatically in the same fashion, a new replacement component 47 may be inserted in the device and mounted on board 48 with the same speed and efficiency.

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. Apparatus for reworking circuit boards carrying surface mounted components by removing a selected solder-connected component from a circuit board and replacing it with a fresh substitute component, comprising
   a base,
   a column projecting upward from the base and incorporating upwardly elongated track means,
   a support arm movably mounted on the track means for up and down traversing movement,
   a heat transfer block pivotally supported on the support arm for angular pivoting movement about
   a substantially vertical axis, maneuvering means connected to the heat transfer block to govern up and down movement and its angular pivoting movement about said axis,
   a board-supporting X-Y table positioned on the base for clamping the circuit board in an adjusted position placing a target component centered on said axis,
   a component gripping head anchored to the heat transfer block with a component gripping socket cavity on said axis facing said circuit board,
   control means connected to initiate a heating cycle delivering heat via the heat transfer block to the periphery of the target component for a predetermined period of time, and
   torquing means connected to drive the gripping head angularly, pivoting about said axis, over an angular sector less then 20 degrees,
   whereby the peripheral terminal leads of the target component have their soldered terminal leads raised to solder-melting temperature, and the angular pivoting movement of the component gripping head shears any cement bonding it to the circuit board, facilitating removal of the component from the board.

2. The apparatus defined in claim 1, wherein said torquing means is connected to apply abrupt sudden torque load to the head and to the component gripped therein, whereby cement adhesively bonding the component to the circuit board is sheared.

3. The apparatus defined in claim 1, wherein said torquing means is reversible and connected to apply torque in opposite directions successively.

4. The apparatus defined in claim 1, wherein said maneuvering means includes a releasable brake locking the head in a component gripping lowered position adjacent to the circuit board, and also including means connected to raise the head when said brake is released.

5. The apparatus defined in claim 1, wherein said maneuvering means includes a platform angularly pivotable about the axis, releasably clamped to a fixed clamping plate, whereby the operator can compensate for angular skewing of a component to be removed.

6. The apparatus defined in claim 5, wherein said torquing means includes a torque motor mounted on the pivotable platform and drivingly connected to deliver torque to the angularly pivotable heat transfer block and the head anchored thereto, whereby torque is delivered to the head at any angularly adjusted head position selected by the operator to grip a skewed component to be removed.

7. The apparatus defined in claim 6, wherein the torquing means further includes sensing means responsive to the extent of relative angular skewing compensation adjustment selected by the operator, said sensing means being connected to govern the corresponding amount of unskewing angular movement of the head needed to bring the component gripped in the head to an unskewed position relative to the circuit board.

8. The apparatus defined in claim 1, further including a light source directing a light beam along said axis to target the center of a surface mounted component to be removed from the circuit board, or the center of the footprint terminal pads on the circuit board upon which a replacement component is to be installed.

9. A method for removing a surface mounted target component having a plurality of peripheral terminal leads each individually solder-connected to a different terminal pad on a printed circuit board, comprising the steps of positioning and clamping the circuit board with the target component intersected by a working axis, delivering heat to the target component's peripheral solder-connected terminal leads to bring them to solder-melting temperature, while diverting said heat from the central portion of the surface mounted target component, applying torque to the target component and rotating it through a small angle less than 20 degrees about the working axis, whereby all solder terminal lead connections are melted and any cement adhesively holding the target component to the circuit board is sheared and the component is released from the board.

10. The method defined in claim 9, further including a preheating step of applying heat to the reverse side of the circuit board behind the target component after clamping the board, whereby the target component's solder connections are warmed before heat is delivered to its terminals.

11. The method defined in claim 9, wherein the torque is applied with abrupt suddenness to shear the adhesive cement by shock torque loading.

12. The method defined in claim 9, wherein the torque is applied successively in opposite directions to shear the adhesive cement by successively reversing torque loading.

13. The method defined in claim 9, further including the initial step of directing a light beam along the working axis to facilitate aligning the target component intersectingly thereon before clamping the board.

14. The method defined in claim 9, wherein the time period during which each step is performed is selected by adjustment of a respective automatic timer, and wherein the performance of the heating and torquing steps is executed by a programmed microcomputer.

15. The methods defined in claim 10, wherein the time period during which each step is performed is selected by adjustment of a respective automatic timer, and wherein the performance of the preheating, the heating and the torquing steps is executed by a programmed microcomputer.

* * * * *